United States Patent
Fukuzumi et al.

(10) Patent No.: US 12,519,060 B2
(45) Date of Patent: Jan. 6, 2026

(54) TECHNIQUES FOR CONCURRENTLY-FORMED CAVITIES IN THREE-DIMENSIONAL MEMORY ARRAYS

(71) Applicant: Micron Technology, Inc., Boise, ID (US)

(72) Inventors: Yoshiaki Fukuzumi, Yokohama (JP); David H. Wells, Boise, ID (US)

(73) Assignee: Micron Technology, Inc., Boise, ID (US)

(*) Notice: Subject to any disclaimer, the term of this patent is extended or adjusted under 35 U.S.C. 154(b) by 672 days.

(21) Appl. No.: 17/816,505

(22) Filed: Aug. 1, 2022

(65) Prior Publication Data

US 2023/0395511 A1   Dec. 7, 2023

Related U.S. Application Data

(60) Provisional application No. 63/365,731, filed on Jun. 2, 2022.

(51) Int. Cl.
| | |
|---|---|
| *H01L 23/535* | (2006.01) |
| *H01L 23/532* | (2006.01) |
| *H10B 41/27* | (2023.01) |
| *H10B 43/27* | (2023.01) |

(52) U.S. Cl.
CPC ........ *H01L 23/535* (2013.01); *H01L 23/5329* (2013.01); *H10B 41/27* (2023.02); *H10B 43/27* (2023.02)

(58) Field of Classification Search
CPC ... H01L 23/535; H01L 23/5329; H10B 41/27; H10B 43/27; H10B 41/10; H10B 41/50; H10B 43/10; H10B 43/50
See application file for complete search history.

(56) References Cited

U.S. PATENT DOCUMENTS

| | | | |
|---|---|---|---|
| 2016/0351497 A1* | 12/2016 | Peri ..................... | H01L 23/5226 |
| 2019/0067314 A1* | 2/2019 | Lu ....................... | H01L 21/76895 |
| 2020/0020715 A1* | 1/2020 | Nakamura ........... | H10D 64/037 |
| 2020/0091170 A1* | 3/2020 | Baek .................... | H10B 43/27 |
| 2020/0168619 A1* | 5/2020 | Zhou .................... | H10B 41/35 |
| 2020/0203364 A1* | 6/2020 | Totoki .................. | H10B 41/35 |
| 2022/0051979 A1* | 2/2022 | Kuroko ................ | H01L 21/76816 |

\* cited by examiner

*Primary Examiner* — Galina G Yushina
(74) *Attorney, Agent, or Firm* — Holland & Hart LLP

(57) ABSTRACT

Methods, systems, and devices for techniques for concurrently-formed cavities in three-dimensional memory arrays are described. As part of forming a memory die, a plurality of cavities may be formed by a set of one or more material removal operations, and different subsets of the plurality of cavities may be used to form different features of the memory die. In some examples, a sacrificial region may be formed in accordance with one or more material addition or removal operations, and such a sacrificial region may include openings that support the formation of various structures of a memory device. After the formation of such structures, the sacrificial region may be isolated from an active region by merging a subset of the previously-formed plurality of cavities.

25 Claims, 27 Drawing Sheets

TECHNIQUES FOR CONCURRENTLY-FORMED CAVITIES IN THREE-DIMENSIONAL MEMORY ARRAYS

CROSS REFERENCE

The present application for patent claims the benefit of U.S. Provisional Patent Application No. 63/365,731 by FUKUZUMI et al., entitled "TECHNIQUES FOR CONCURRENTLY-FORMED CAVITIES IN THREE-DIMENSIONAL MEMORY ARRAYS," filed Jun. 2, 2022, assigned to the assignee hereof, and expressly incorporated by reference herein.

FIELD OF TECHNOLOGY

The following relates to one or more systems for memory, including techniques for concurrently-formed cavities in three-dimensional memory arrays.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

In some memory manufacturing operations, one or more materials may be deposited over a substrate, such as a semiconductor substrate, and portions of the one or more materials may be removed to form cavities through the one or more materials. Cavities may be formed to support the subsequent formation of various features of a memory die (e.g., of a memory device). For example, memory cells may be formed at least in part by depositing one or more storage materials in a set of cavities. Additionally, or alternatively, trenches may be formed from other sets of cavities to isolate regions of a memory array (e.g., to form isolation regions, to isolate blocks of memory cells). However, forming different sets of cavities with respective distinct operations may be associated with relatively high processing costs or potential for misalignment between features of a memory die.

In accordance with examples as disclosed herein, a set of multiple cavities may be formed in a memory die by a set of one or more material removal operations (e.g., dry etching operations, reactive-ion etching (RIE) operations), and different subsets of the cavities may be used to form different features of a memory device (e.g., a subset of cavities to support forming memory cells, a respective subset of cavities to support form one or more isolation regions, a subset of cavities to support forming support structures). In some examples, a sacrificial region (e.g., a staircase region, a sacrificial island) may be formed in accordance with one or more material addition or removal operations, and such a sacrificial region may include openings (e.g., permeations) that support the formation of various structures of a memory die (e.g., access lines at different levels of a memory die each having respective electrical contacts for differential addressing). After the formation of such structures, the sacrificial region may be isolated (e.g., electrically isolated) from an active region (e.g., a region including access lines and a block of memory cells) by merging a subset of the previously-formed cavities. Shared operations to form such a set of multiple cavities may be implemented to reduce a quantity of operations to form features of a memory die, thereby reducing processing costs and improving process margins associated with the manufacturing of the memory die, among other benefits.

Figure 1:
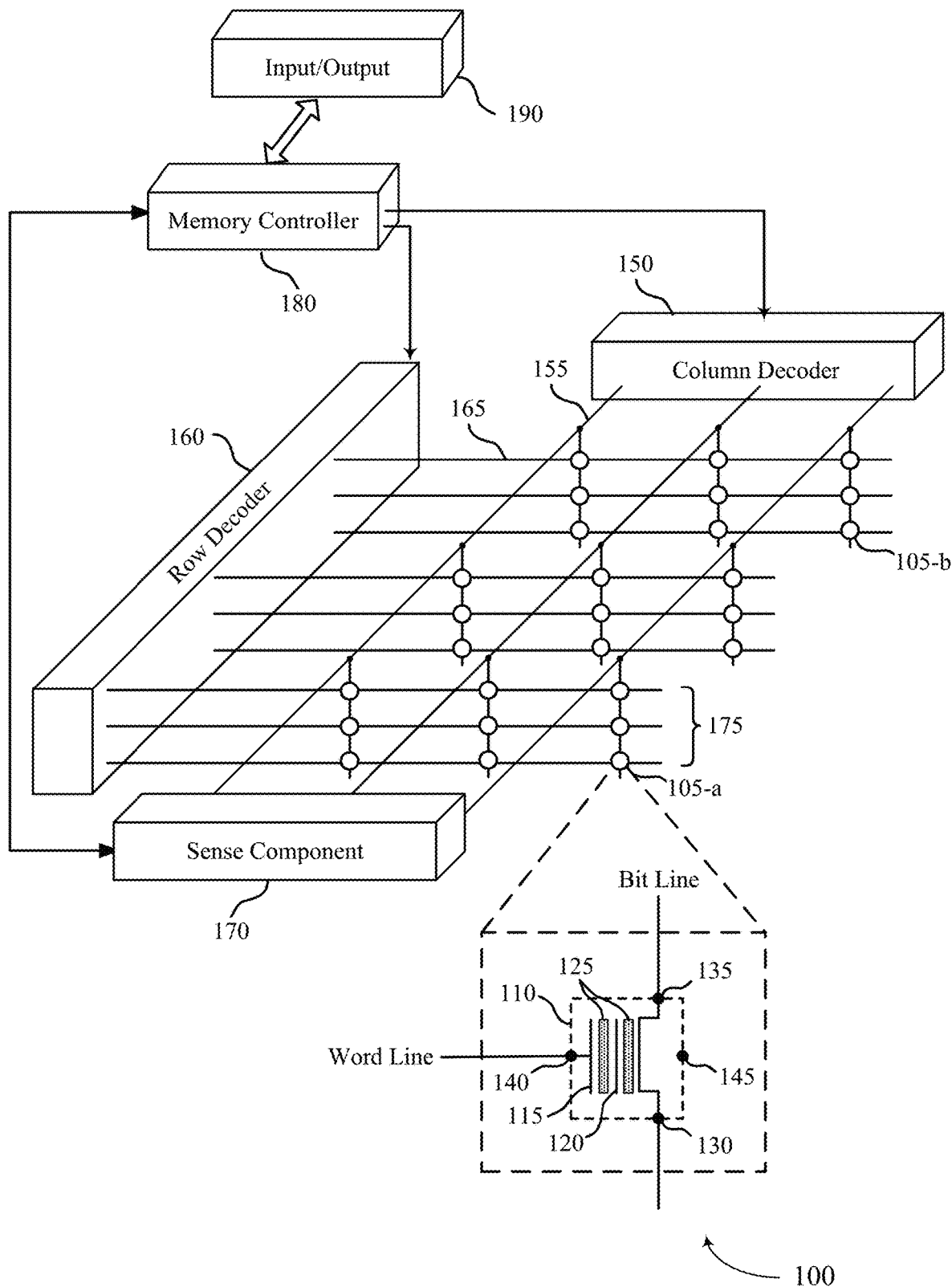
FIG. 1 illustrates an example of a system that supports techniques for concurrently-formed cavities in three-dimensional memory arrays in accordance with examples as disclosed herein.
Figure 2:
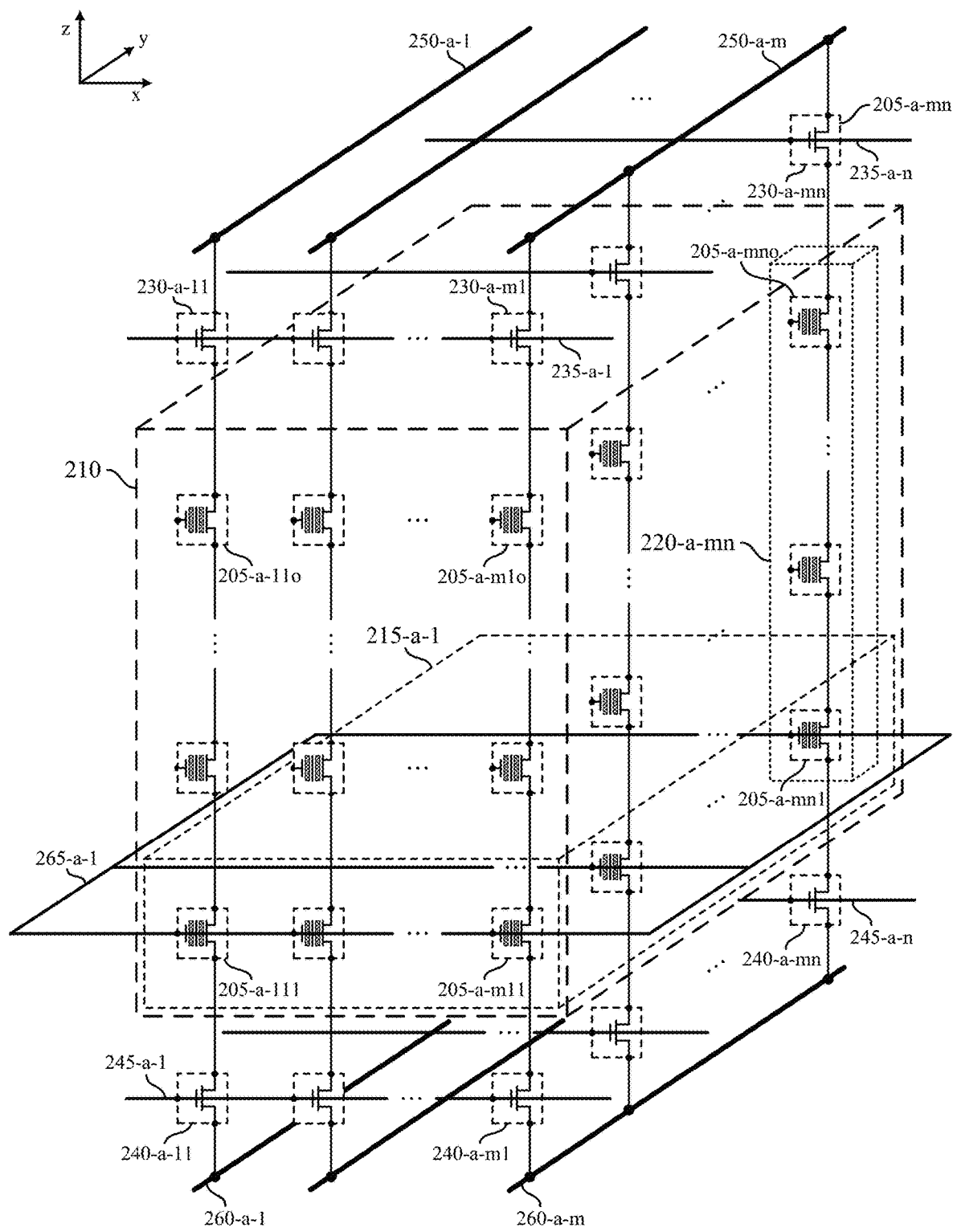
FIG. 2 illustrates an example of a memory architecture that supports techniques for concurrently-formed cavities in three-dimensional memory arrays in accordance with examples as disclosed herein.

Features of the disclosure are initially described in the context of systems, devices, and circuits with reference to FIGS. 1 and 2. Features of the disclosure are described in the context of operations for material arrangements with reference to FIGS. 3 through 23. These and other features of the disclosure are further illustrated by and described in the context of a flowchart that relate to techniques for concurrently-formed cavities in three-dimensional memory arrays with reference to FIG. 24.

FIG. 1 illustrates an example of a memory device 100 that supports techniques for concurrently-formed cavities in three-dimensional memory arrays in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells 105, such as memory cell 105-a and memory cell 105-b. In some examples, a memory cell 105 may be a NAND memory cell, such as in the blow-up diagram of memory cell 105-a. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-a that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-a is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., a channel between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150, among other addressing architectures. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. Upon accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

In some techniques for manufacturing a memory device 100 (e.g., for manufacturing a memory die that includes one or more aspects of the memory device 100), one or more materials may be deposited over a substrate, such as a semiconductor substrate, and portions of the one or more materials may be removed to form cavities through the one or more materials. Cavities may be formed to support the subsequent formation of various features of the memory device 100. For example, memory cells 105 may be formed at least in part by depositing one or more storage materials in a set of cavities. Additionally, or alternatively, trenches may be formed from other sets of cavities to isolate regions of a memory array (e.g., to form isolation regions, to isolate blocks of memory cells 105). However, forming different sets of cavities with respective distinct operations may be associated with relatively high processing costs or potential for misalignment between features of the memory device 100.

In accordance with examples as disclosed herein, a set of multiple cavities may be formed by a set of one or more material removal operations (e.g., dry etching operations, RIE operations), and different subsets of the cavities may be used to form different features of a memory device 100 (e.g., a subset of cavities to support forming memory cells 105, a respective subset of cavities to support form one or more isolation regions, a subset of cavities to support forming support structures). In some examples, a sacrificial region (e.g., a staircase region, a sacrificial island) may be formed in accordance with one or more material addition or removal operations, and such a sacrificial region may include openings (e.g., permeations) that support the formation of various structures of the memory device 100 (e.g., access lines such as word lines 165 or bit lines 155 at different levels of a memory die each having respective electrical contacts for differential addressing). After the formation of such structures, the sacrificial region may be isolated (e.g., electrically isolated) from an active region (e.g., a region including access lines and a block of memory cells 105) by merging a subset of the previously-formed set of cavities. Shared operations to form such a set of multiple cavities may be implemented to reduce a quantity of operations to form features of the memory device 100, thereby reducing processing costs and improving process margins associated with the manufacturing of a memory device 100, among other benefits.

FIG. 2 illustrates an example of a memory architecture 200 that supports techniques for concurrently-formed cavities in three-dimensional memory arrays in accordance with examples as disclosed herein. The memory architecture 200 may be an example of a portion of a memory device, such as a memory device 100. Although some elements of a set of elements (e.g., an array of elements) are included in FIG.

2, some elements may be omitted for the sake of visibility and clarity of the depicted elements. Moreover, although some elements included in FIG. 2 are labeled with reference numbers, some other corresponding elements are not labeled, though they are the same or would be understood by a person having ordinary skill in the art to be similar. Aspects of the memory architecture 200 may be described with reference to an x-direction, a y-direction, and a z-direction of the illustrated coordinate system.

The memory architecture 200 includes a three-dimensional array of memory cells 205, which may be examples of memory cells 105 described with reference to FIG. 1 (e.g., transistors 110, NAND memory cells). In some examples, the memory cells 205 may be connected in a 3D NAND configuration. For example, the memory cells 205 may be included in a block 210, which may be arranged as a 3D array of m memory cells along the x-direction, n memory cells along the y-direction, and o memory cells along the z-direction. Each memory cell 205 may be located (e.g., addressed) in accordance with an index i along the x-direction, an index j along the y-direction, and an index k along the z-direction (e.g., for locating a memory cell 205-$a$-$ijk$). A memory device 100 may include any quantity of one or more blocks 210 in accordance with examples as disclosed herein, and different blocks 210 may be adjacent along the x-direction, along the y-direction, or along the z-direction, or any combination thereof.

In the example of memory architecture 200, the block 210 may be divided into a set of pages 215 (e.g., a quantity of o pages 215) along the z-direction, including a page 215-$a$-1 associated with memory cells 205-$a$-111 through 205-$a$-$mn$1. In some examples, each page 215 may be associated with a same word line 265, (e.g., a word line 165 described with reference to FIG. 1), which may be coupled with a control gate 115 of each of the memory cells 205 of the page 215. For example, page 215-$a$-1 may be associated with a word line 265-$a$-1, and other pages 215-$a$-$i$ may be associated with a different respective word line 265-$a$-$i$ (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-$a$-$mn$ associated with memory cells 205-$a$-$mn$1 through 205-$a$-$mno$. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar channel (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be programmed (e.g., set to a logic 0 value) and read from in accordance with a granularity, such as at the granularity of the page 215, but may not be erasable (e.g., reset to a logic 1 value) in accordance with the granularity, such as at the granularity of the page 215. For example, NAND memory may instead be erasable in accordance with a different (e.g., higher) level of granularity, such as at the level of granularity the block 210. In some cases, a memory cell 205 may be erased before it may be re-programmed. Different memory devices may have different read, write, or erase characteristics.

In some examples, each string 220 of a block 210 may be coupled with a respective transistor 230 (e.g., a string select transistor, a drain select transistor) at one end of the string 220 (e.g., along the z-direction) and a respective transistor 240 (e.g., a source select transistor, a ground select transistor) at the other end of the string 220. In some examples, a drain of each transistor 230 may be coupled with a bit line 250 of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line). Thus, a transistor 230 may be used to couple a string 220 with a bit line 250 based on applying a voltage to the select line 235, and thus to the gate of the transistor 230. Although illustrated as separate lines along the x-direction, in some examples, select lines 235 may be common to all the transistors 230 associated with the block 210 (e.g., a commonly biased string select node). For example, like the word lines 265 of the block 210, select lines 235 associated with the block 210 may, in some examples, be implemented as a planar conductor (e.g., in an xy-plane) that is coupled with each of the transistors 230 associated with the block 210.

In some examples, a source of each transistor 240 associated with the block 210 may be coupled with a source line 260 of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line). Thus, a transistor 240 may be used to couple a string 220 with a source line 260 based on applying a voltage to the select line 245, and thus to the gate of the transistor 240. Although illustrated as separate lines along the x-direction, in some examples, select lines 245 also may be common to all the transistors 240 associated with the block 210 (e.g., a commonly biased ground select node). For example, like the word lines 265 of the block 210, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corresponding bit line 250 while the corresponding source line 260 may be grounded or otherwise biased at a voltage lower than the voltage applied to the bit line 250. In some examples, concurrently, voltages may be applied to the select line 235 and the select line 245 that are above the threshold voltages of the transistor 230 and the transistor 240, respectively, for the memory cell 205, thereby activating the transistor 230 and transistor 240 such that a channel associated with the string 220 that includes the memory cell 205 (e.g., a pillar channel) may be electrically connected with (e.g., electrically connected between) the corresponding bit line 250 and source line 260. A channel may be an electrical path through the memory cells 205 in the string 220 (e.g., through the sources and drains of the transistors in the memory cells 205 of the string 220) that may conduct current under some operating conditions.

In some examples, concurrently, multiple word lines 265 (e.g., in some cases all word lines 265) of the block 210—except a word line 265 associated with a page 215 of the memory cell 205 to be read—may concurrently be set to a voltage (e.g., VREAD) that is higher than the threshold voltage (VT) of the memory cells 205. VREAD may cause all memory cells 205 in the unselected pages 215 be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1), and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic 0). Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-a of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may all share a common word line 265 and a common bulk. For a memory cell 205 of the page 215 for which it is not desired to write a logic 0 (e.g., not desired to program the memory cell 205), the corresponding bit line 250 may be set to a relatively low voltage (e.g., ground), which may inhibit the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-a of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may all share a common bulk.

In some techniques for manufacturing a memory die in accordance with the memory architecture 200, one or more materials may be deposited over a substrate, such as a semiconductor substrate, and portions of the one or more materials may be removed to form cavities through the one or more materials. Cavities may be formed to support the subsequent formation of various features of the memory architecture 200. For example, memory cells 205 may be formed at least in part by depositing one or more storage materials in a set of cavities. Additionally, or alternatively, trenches may be formed from other sets of cavities to isolate regions of the memory die (e.g., to form isolation regions, to isolate blocks 210 from one another). However, forming different sets of cavities with respective distinct operations may be associated with relatively high processing costs or potential for misalignment between features of the memory architecture 200.

In accordance with examples as disclosed herein, a set of multiple cavities may be formed by a set of one or more material removal operations (e.g., dry etching operations, RIE operations), and different subsets of the cavities may be used to form different features of the memory architecture 200 (e.g., a subset of cavities to support forming memory cells 205, a respective subset of cavities to support form one or more isolation regions, a subset of cavities to support forming support structures). In some examples, a sacrificial region (e.g., a staircase region, a sacrificial island) may be formed in accordance with one or more material addition or removal operations, and such a sacrificial region may include openings (e.g., permeations) that support the formation of various structures of the memory architecture 200 (e.g., word lines 265 lines at different levels of the memory architecture 200 each having respective electrical contacts for differential addressing). After the formation of such structures, the sacrificial region may be isolated (e.g., electrically isolated) from an active region (e.g., a region including word lines 265 and a block 210) by merging a subset of the previously-formed cavities. Shared operations to form such a set of multiple cavities may be implemented to reduce a quantity of operations to form features of the memory architecture 200, thereby reducing processing costs and improving process margins associated with the manufacturing of a memory device (e.g., of a memory die), among other benefits.

FIGS. 3 through 23 illustrate an example of a material arrangement 300 that supports techniques for concurrently-formed cavities in three-dimensional memory arrays in accordance with examples as disclosed herein. For example, FIGS. 3 through 23 may illustrate aspects of a sequence of operations for fabricating aspects of a material arrangement 300, which may be an example of implementing aspects of a memory architecture 200 described with reference to FIG. 2. Each of FIGS. 3 through 23 may illustrate aspects of the material arrangement 300 after different subsets of or alternatives of the fabrication operations for forming the material arrangement 300 (e.g., illustrated as a material arrangement 300-a after a first set of one or more manufacturing operations, as a material arrangement 300-b after a second set of one or more manufacturing operations, and so on). Each view of the figures may be described with reference to an x-direction, a y-direction, and a z-direction as illustrated, which may correspond to the respective directions described with reference to the memory architecture 200.

Some of the provided figures include section views that illustrate example cross-sections of the material arrangement 300. For example, in FIGS. 3 through 23, a view "SECTION A-A" may be associated with a cross-section in an x'y'-plane (e.g., in accordance with a cut plane A-A, which may be associated with an x'y'z coordinate system rotated about the z-direction relative to the xyz coordinate system) through a portion of the material arrangement 300 associated with one or more cavities (e.g., including at least one cavity for a memory cell 205), a view "SECTION B-B" may be associated with a cross-section in a yz-plane (e.g., in accordance with a cut plane B-B) through a portion of the material arrangement 300 that is associated with one or more cavities (e.g., including at least one cavity for forming a sacrificial region), and a view "SECTION C-C" may be associated with a stepped cross-section generally in an xz-plane (e.g., in accordance with a cut C-C, which may be associated with a first xz-plane at a first y-location and a second xz-plane at a second y-location) through a portion of the material arrangement 300 that is associated with one or more cavities (e.g., including at least one cavity for forming a sacrificial region, including at least one cavity for forming word lines 265, including at least one cavity for forming select lines 235). Although the material arrangement 300 illustrates examples of some relative dimensions and quantities of various features, aspects of the material arrangement 300 may be implemented with other relative dimensions or quantities of such features in accordance with examples as disclosed herein.

Operations illustrated in and described with reference to FIGS. 3 through 23 may be performed by a manufacturing system, such as a semiconductor fabrication system configured to perform additive operations (e.g., deposition, bonding), subtractive operations (e.g., etching, trenching, planarizing, polishing), and supporting operations (e.g., masking, patterning, photolithography, aligning), among other operations that support the described techniques. In some examples, operations performed by such a manufacturing system may be supported by a process controller or its components as described herein.

Figure 3:
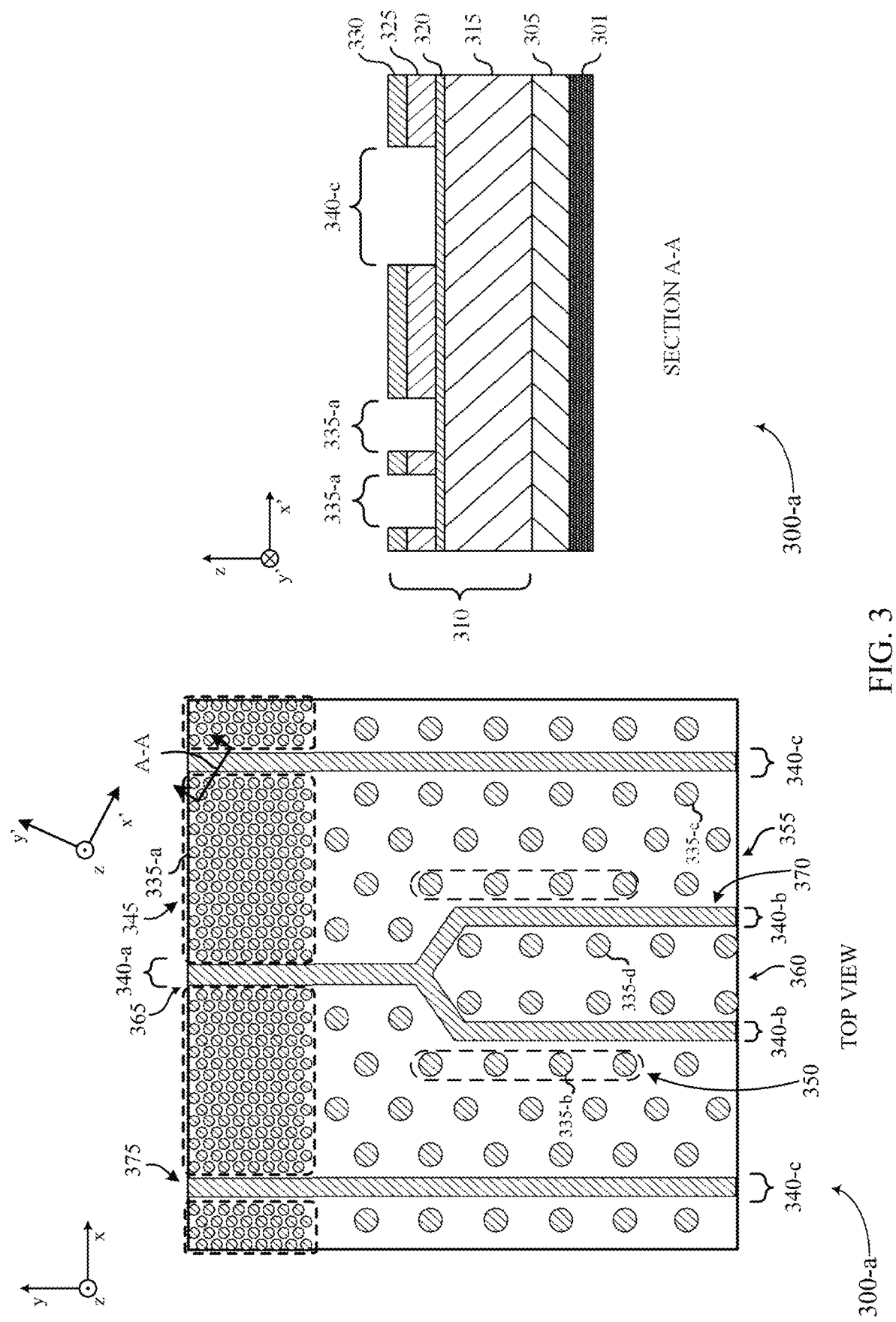
FIGS. 3 through 23 illustrate examples of operations that support techniques for concurrently-formed cavities in three-dimensional memory arrays in accordance with examples as disclosed herein.

FIG. 3 illustrates the material arrangement 300 (e.g., as a material arrangement 300-a) after a first set of one or more manufacturing operations. The first set of operations may include forming a layer of a material 305 (e.g., depositing the material 305 over a substrate 301), which may include a conductive material (e.g., a metal, a metal alloy, an electrically conductive ceramic such as tungsten silicide). In some examples, the layer of material 305 may support a ground node of memory architecture 200, such as a source node of one or more blocks 210 (e.g., source lines 260, a common source). Although the layer of material 305 may be deposited in contact with the substrate 301, in some other examples, the material arrangement 300 may include other materials or components between the layer of material 305 and the substrate 301, such as interconnection or routing circuitry (e.g., access lines, power routing lines), control circuitry (e.g., transistors, logic, decoder circuitry, aspects of a memory controller 180, a column decoder 150, a row decoder 160, a sense component 170, an input/output component 190), among other circuitry, which may include various conductor, semiconductor, or dielectric materials between the layer of material 305 and the substrate 301. For example, the material arrangement 300 may include a layer including thin-film-transistors (TFT) between the substrate 301 and the layer of material 305, among others. In some examples, the substrate 301 itself may include such interconnection or routing circuitry.

The first set of operations may also include depositing a stack of layers 310 (e.g., a first stack) over the substrate 301 (e.g., over the layer of material 305). The stack of layers 310 may include a layer of a material 315, a layer of a material 320, a layer of a material 325, and a layer of a material 330. In some examples, the material 315 may be a semiconductor material (e.g., doped polysilicon, n+ doped polysilicon), which may support forming a channel portion of transistors 240. In some examples, each of the material 320, the material 325, and the material 330 may be a sacrificial material that is patterned and removed in later processing operations, and each may be selected to support various techniques for differential processing (e.g., differential etching, high selectivity). For example, the material 320 may be a dielectric material (e.g., an oxide, an oxide of silicon, a liner oxide), the material 325 may be a semiconductor material (e.g., polysilicon), and the material 330 may be a dielectric material (e.g., an oxide, an oxide of silicon, a cap oxide), which may be the same as the material 320.

The first set of operations may also include operations (e.g., etching operations, photolithography operations) that support forming cavities 335 and trenches 340, which may include operations (e.g., common operations) that form the cavities 335 and the trenches 340 concurrently. For example, the first set of manufacturing operations may include depositing a masking material (e.g., a hardmask), not shown, over the stack of layers 310. In some cases, the masking material may be deposited in a pattern (e.g., as viewed in an xy-plane), where the masking material does not cover locations at which cavities 335 and the trenches 340 will be formed. In some examples, the first set of manufacturing operations may then include forming the cavities 335 and the trenches 340 based on etching through the material 330 and the material 325 (e.g., exposing sidewalls of the material 330 and the material 325, exposing surfaces of the material 320 in an xy-plane, via an etching operation, such as a dry etching operation, a photolithography operation), where portions of the material 330 and the material 325 are removed at locations not covered by the masking material. The trenches 340 may have openings that are relatively elongated (e.g., along the y-direction). The trenches 340 may be connected with each other along the x-direction (not shown) to provide a trench isolation around each portion of the material arrangement 300 that is associated with a block 210 (e.g., where trenches 340 may enclose or surround a block 210). Trenches 340-b may diverge (e.g., split) from a trench 340-a and may connect with each other at another point along the x-direction (not shown) to provide a trench isolation around a region 360 (e.g., a sacrificial region, a sacrificial island). Although SECTION A-A illustrates aspects of cavities 335-a and trenches 340-c, similar aspects may be formed for other cavities 335 and other trenches 340 of the material arrangement 300-a (e.g., in accordance with cross-sections in an xy-plane as illustrated in the top view of FIG. 3).

In some cases, a subset of cavities 335 (e.g., cavities 335-a) may be formed in a region 345 (e.g., an array region, a block region, a region associated with a block 210) to support the formation of strings of memory cells 205 (e.g., associated with forming pillar channels, or transistors 240, among other features of a respective string 220). In some cases, a subset of cavities 335 (e.g., cavities 335-b) may be formed in a region 350 (e.g., a socket region, a connector region, a contact region) to support the formation of electrical contacts for addressing (e.g., biasing) word lines 265 of a block 210. In some cases, a subset of cavities 335 (e.g., cavities 335-c) may be formed in a region 355 (e.g., a support region) to support the formation of structural supports, which may improve structural integrity and tolerances for forming aspects of the material arrangement 300. In some examples, a combination of a region 345, a region 350, and a region 355 may be associated with an active portion of the material arrangement 300 (e.g., an electrically active portion, a portion that supports operations of a respective block 210), whereas other regions of the material arrangement 300 may be considered to be electrically inactive, or not related to operations of a respective block 210).

In some cases, a subset of cavities 335 (e.g., cavities 335-d) may be formed in the region 360 to support the formation of a staircase structure of the material arrangement 300. The trenches 340-a and 340-c may be formed regions 365 and regions 375, respectively (e.g., regions which support isolation between blocks 210). The trenches 340-b may be formed in regions 370 (e.g., a region which supports the isolation of the region 360 from an active portion of the material arrangement 300, such as a region between a region 360 and adjacent regions 355). In some examples, cavities 335-a may have a different size (e.g., a smaller diameter, as viewed in an xy-plane) than other cavities (e.g., 335-b through 335-d). In some examples, the cavities 335 and the trenches 340 may be formed using common material removal operations. In some examples, the formation of cavities 335 and trenches 340 may support the formation of etch stop features for subsequent operations of forming aspects of the material arrangement 300.

Figure 4:
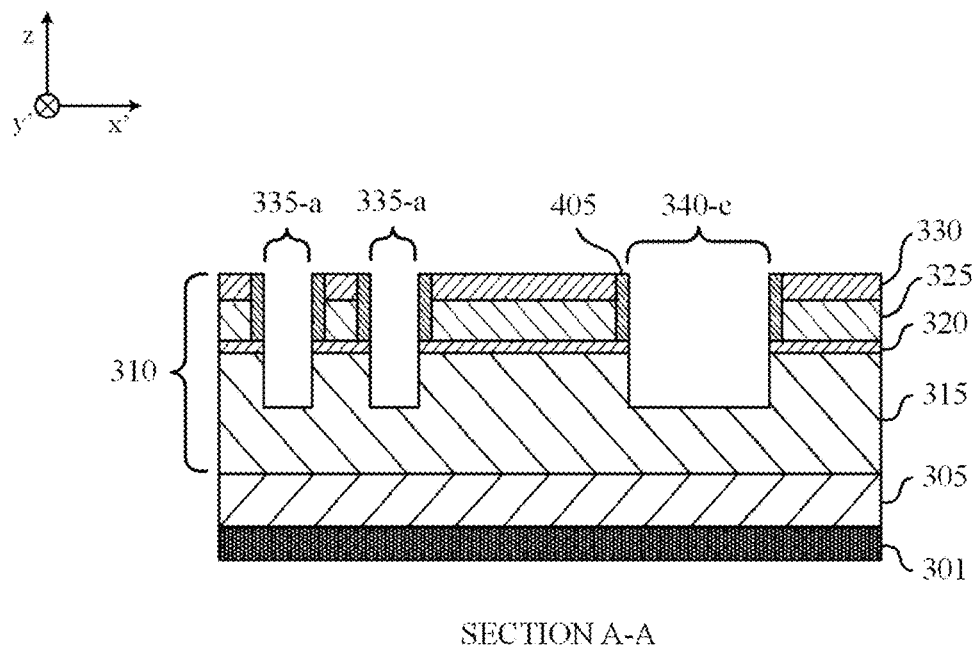

FIG. 4 illustrates the material arrangement 300 (e.g., as a material arrangement 300-b) after a second set of one or more manufacturing operations, as a cross-sectional side view (e.g., relative to the cut plane A-A). Although FIG. 4 illustrates some features associated with cavities 335-a and trenches 340-c (e.g., of regions 345 and 375), such features may be similarly associated with other cavities 335 and other trenches 340 of the material arrangement 300-b (not shown).

The second set of operations may include further operations (e.g., a nitride deposition operation, an etching operation) that support forming the cavities 335 and the trenches 340. For example, the second set of manufacturing operations may include depositing a material 405 (e.g., a liner material, a nitride material, a nitride of silicon) on exposed surfaces of the cavities 335 and exposed surfaces of the trenches 340 (e.g., sidewalls, bottom surfaces). In some cases, the second set of operations may also include a material removal operation (e.g., dry etch operation aligned with the cavities 335 and the trenches 340), where a portion of the material 405 (e.g., a portion in contact with the material 320), a portion of the material 320, and a portion of the material 315 is removed from (e.g., along a direction of) the cavities 335 and the trenches 340, thereby extending the cavities 335 and trenches 340 along the z-direction. The second set of operations may include operations that expose sidewalls of the material 320, and sidewalls and a bottom surface of the material 315, associated with the cavities 335 and the trenches 340.

Figure 5:
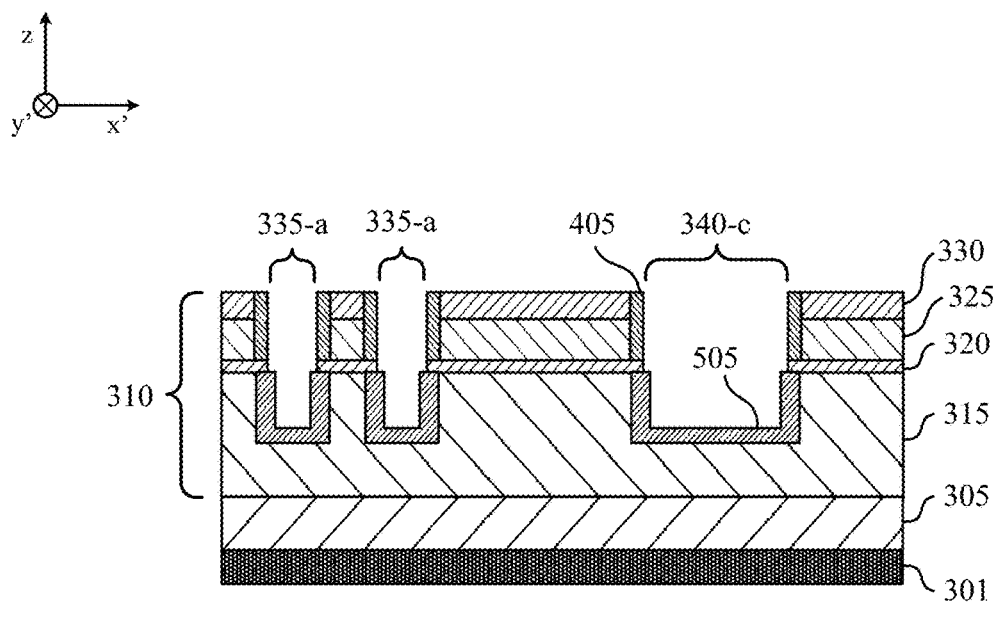

FIG. 5 illustrates the material arrangement 300 (e.g., as a material arrangement 300-c) after a third set of one or more manufacturing operations, as a cross-sectional side view (e.g., relative to the cut plane A-A). Although FIG. 5 illustrates some features associated with cavities 335-a and trenches 340-c, such features may be similarly associated with other cavities 335 and other trenches 340 of the material arrangement 300-c (not shown).

The third set of manufacturing operations may include operations (e.g., an oxidation operation) that support forming features in the cavities 335 and the trenches 340. For example, the third set of manufacturing operations may include oxidizing the material 315 (e.g., exposed surfaces of the material 315) to form a material 505 (e.g., oxidized doped polysilicon), which may support the formation of etch stops in the cavities 335 and the trenches 340. In some examples, the material 405 may cover the surface of the material 325 (e.g., a sacrificial polysilicon), such the material 325 is not oxidized.

Figure 6:
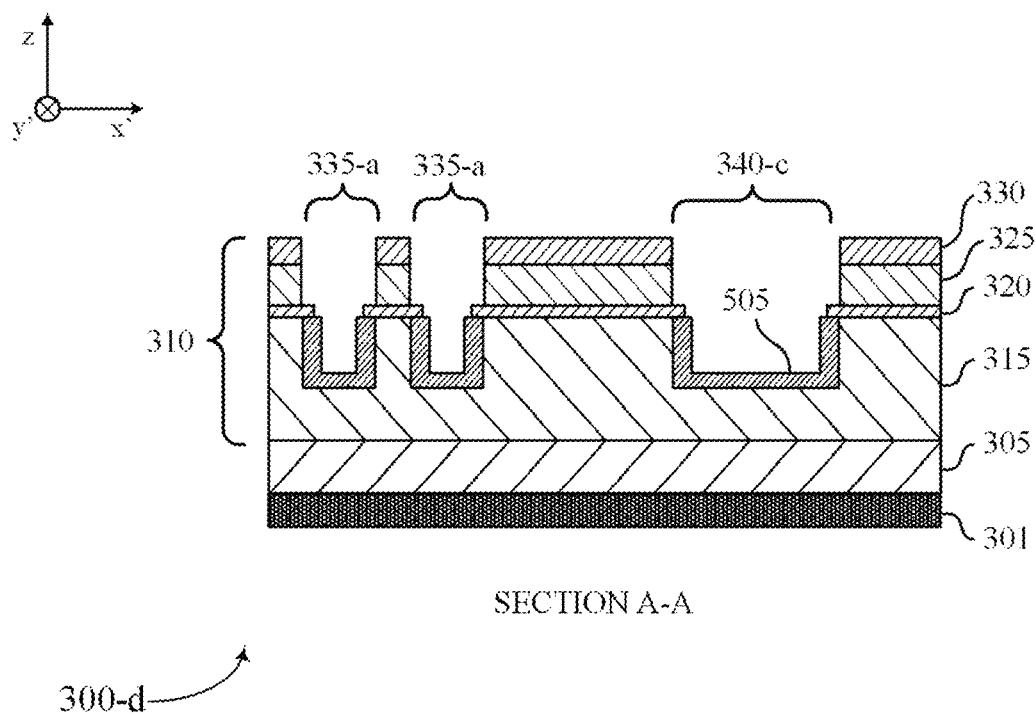

FIG. 6 illustrates the material arrangement 300 (e.g., as a material arrangement 300-d) after a fourth set of one or more manufacturing operations, as a cross-sectional side view (e.g., relative to the cut plane A-A). Although FIG. 6 illustrates some features associated cavities 335-a and trenches 340-c, such features may be similarly associated with other cavities 335 and other trenches 340 of the material arrangement 300-d (not shown).

The fourth set of manufacturing operations may include further operations (e.g., an etching operation, a wet etching operation) that support forming features in the cavities 335 and the trenches 340. For example, the fourth set of manufacturing operations may include removing the material 405 from the cavities 335 and the trenches 340, which may expose sidewalls of the material 325 and the material 330 associated with the cavities 335 and the trenches 340.

Figure 7:
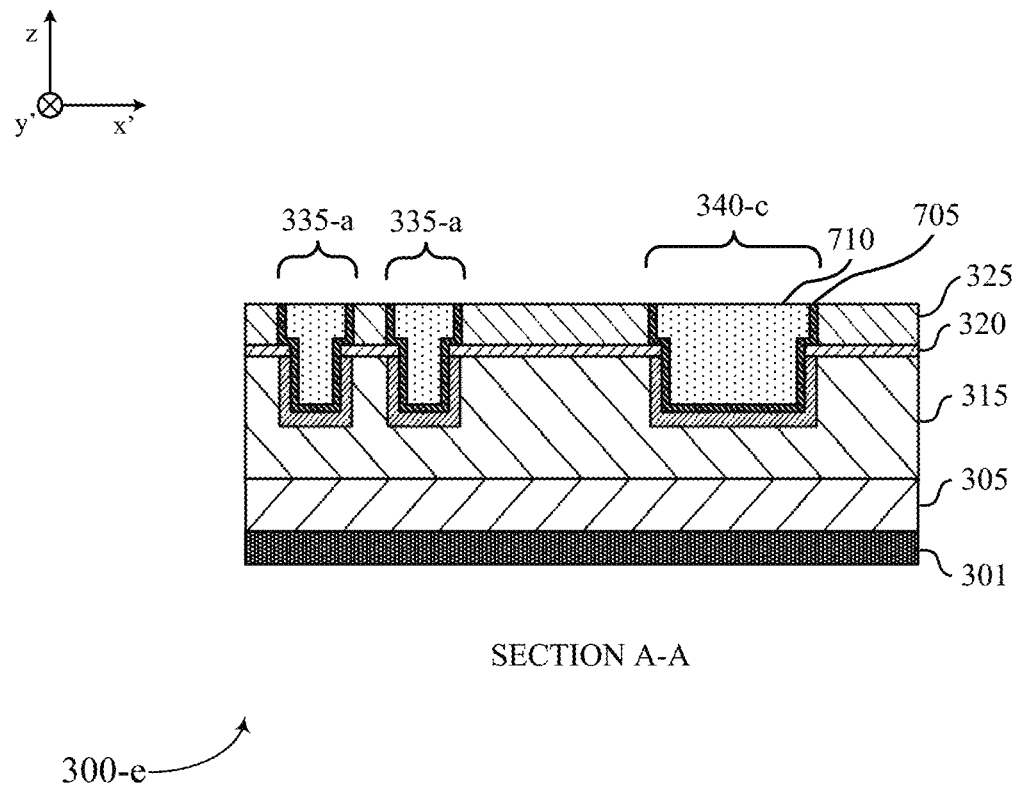

FIG. 7 illustrates the material arrangement 300 (e.g., as a material arrangement 300-*e*) after a fifth set of one or more manufacturing operations, as a cross-sectional side view (e.g., relative to the cut plane A-A). Although FIG. 7 illustrates some features associated cavities 335-*a* and trenches 340-*c*, such features may be similarly associated with other cavities 335 and other trenches 340 of the material arrangement 300-*e* (not shown).

The fifth set of operations may include operations (e.g., one or more deposition operations) that support forming features in the cavities 335 and the trenches 340. For example, the fifth set of manufacturing operations may include depositing material portions in the cavities 335 and the trenches 340 (e.g., concurrently). In some cases, the material portions may include a material 705 and a material 710. The material 705 may include a liner material (e.g., titanium nitride), which may be deposited in contact with the exposed surfaces of the cavities 335 and the trenches 340. The material 710 may include another material (e.g., tungsten), and may be deposited in contact with the material 705. In some examples, the material portions (e.g., the material 705, or the material 710, or both) may be examples of etch stopping features (e.g., etch stops, associated with the cavities 335 and trenches 340) used in later operations.

Figure 8:
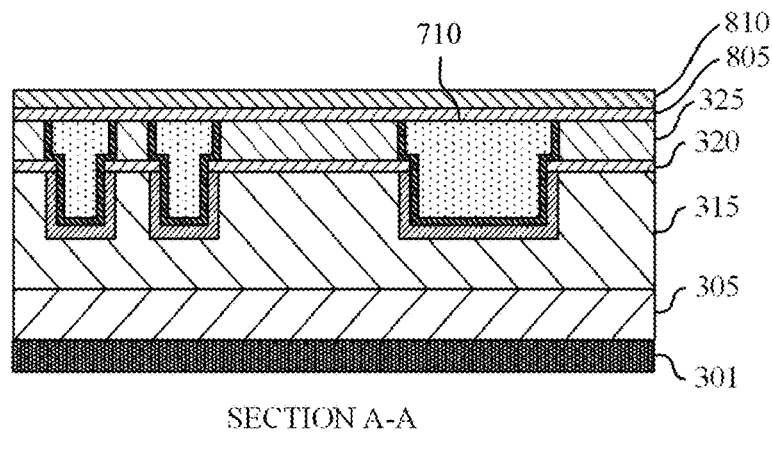

FIG. 8 illustrates the material arrangement 300 (e.g., as a material arrangement 300-*f*) after a sixth set of one or more manufacturing operations, as a cross-sectional side view (e.g., relative to the cut plane A-A). The sixth set of operations may include further operations (e.g., an oxide layer deposition operation, a polysilicon layer deposition) to build layers of the material arrangement 300. For example, the sixth set of operations may include depositing a layer of a material 805 and a layer of a material 810 (e.g., over remaining portions of the stack of layers 310, over the material 325, over a top surface of the material arrangement 300 as prepared by the fifth set of operations). The material 805 may be an oxide material (e.g., an oxide of silicon), and the material 810 may be a semiconductor material (e.g., polysilicon). In some examples, the material 805 may be a sacrificial material (e.g., removed in one or more later operations), and the material 810 may support formation of one or more transistor structures (e.g., as part of a channel of transistors 240 of the memory architecture 200).

Figure 9:
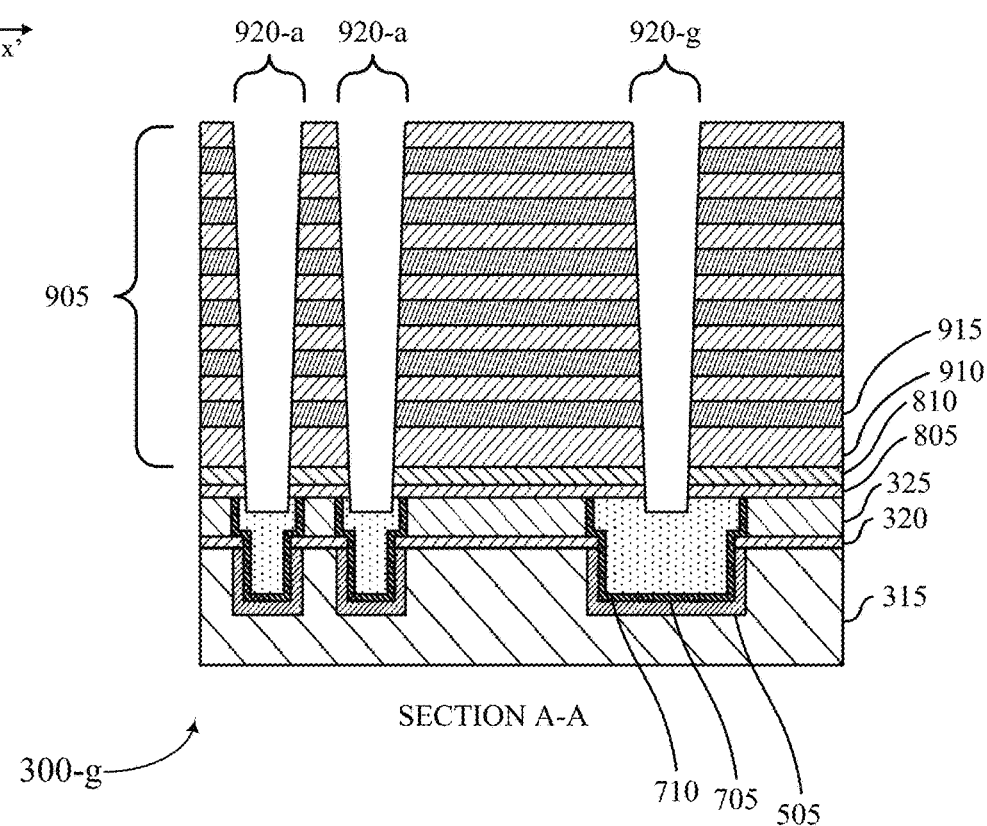

FIG. 9 illustrates the material arrangement 300 (e.g., as a material arrangement 300-*g*) after a seventh set of one or more manufacturing operations, as a cross-sectional side view (e.g., relative to the cut plane A-A). Although the substrate 301 and the layer of the material 305 are omitted from certain illustrations, such features may remain in various examples of the material arrangement 300. Further, although FIG. 9 illustrates some features associated with cavities 335-*a* and trenches 340-*c*, such features may be similarly associated with other cavities 335 and other trenches 340 of the material arrangement 300-*g* (not shown).

The seventh set of operations may include operations that support depositing a second stack of material layers (e.g., as one or more deposition operations). For example, the seventh set of operations may include depositing a stack of layers 905 over the material 810. The stack of layers 905 may include alternating layers of a material 910 (e.g., first material) and a material 915 (e.g., second material, in accordance with alternating material deposition operations). In some examples, the material 910 may include a dielectric material (e.g., an oxide, a tier oxide, an oxide of silicon), which may provide electrical isolation between other layers of the stack of layers 905 (e.g., between pages 215). In some examples, the material 910 may be the same as the material 805. The material 915 may include various materials that are different than the material 910 (e.g., a nitride material, a nitride of silicon), and may be an example of a sacrificial material (e.g., to support subsequent differential etching procedures). Although the stack of layers 905 is illustrated with thirteen layers (e.g., seven layers of the material 910 and six layers of the material 915), a stack of layers 905 in accordance with examples as disclosed herein may include any quantity of layers of each of two or more materials (e.g., tens of layers, hundreds of layers, and so on).

The seventh set of operations may also include operations (e.g., dry etching operations, photolithography operations) for forming cavities 920 through the stack of layers 905, where forming the cavities 920 may expose a portion of the material 710 (e.g., using the material 710 as a cavity etch stop or trench etch stop). The cavities 920 may be formed in different patterns in the different regions of the material arrangement 300-*g*. For example, a respective cavity 920 may be aligned (e.g., in an xy-plane) with a location each cavity 335 (e.g., cavities 920-*a* aligned with cavities 335-*a*, in a region 345), and a respective row of cavities 920 may be aligned along a location of each trench 340 (e.g., rows of cavities 920-*g* aligned along trenches 340-*a*, in a region 375). In some cases, a subset of cavities 920 (e.g., cavities 920-*a*) may be formed in the regions 345, a subset of cavities 920 (e.g., cavities 920-*b*) may be formed in the regions 350, a subset of cavities 920 (e.g., cavities 920-*c*) may be formed in the regions 355, a subset of cavities 920 (e.g., cavities 920-*d*) may be formed in the regions 360, a subset of cavities 920 (e.g., cavities 920-*e*) may be formed in the regions 365, a subset of cavities 920 (e.g., cavities 920-*f*) may be formed in the regions 370, and a subset of cavities 920 (e.g., cavities 920-*g*) may be formed in the regions 375. Thus, the seventh set of operations may be an example of forming a plurality of cavities through a stack of material layers, where different subsets of the cavities 920 may support different features of a memory device (e.g., different features of the memory architecture 200).

Figure 10:
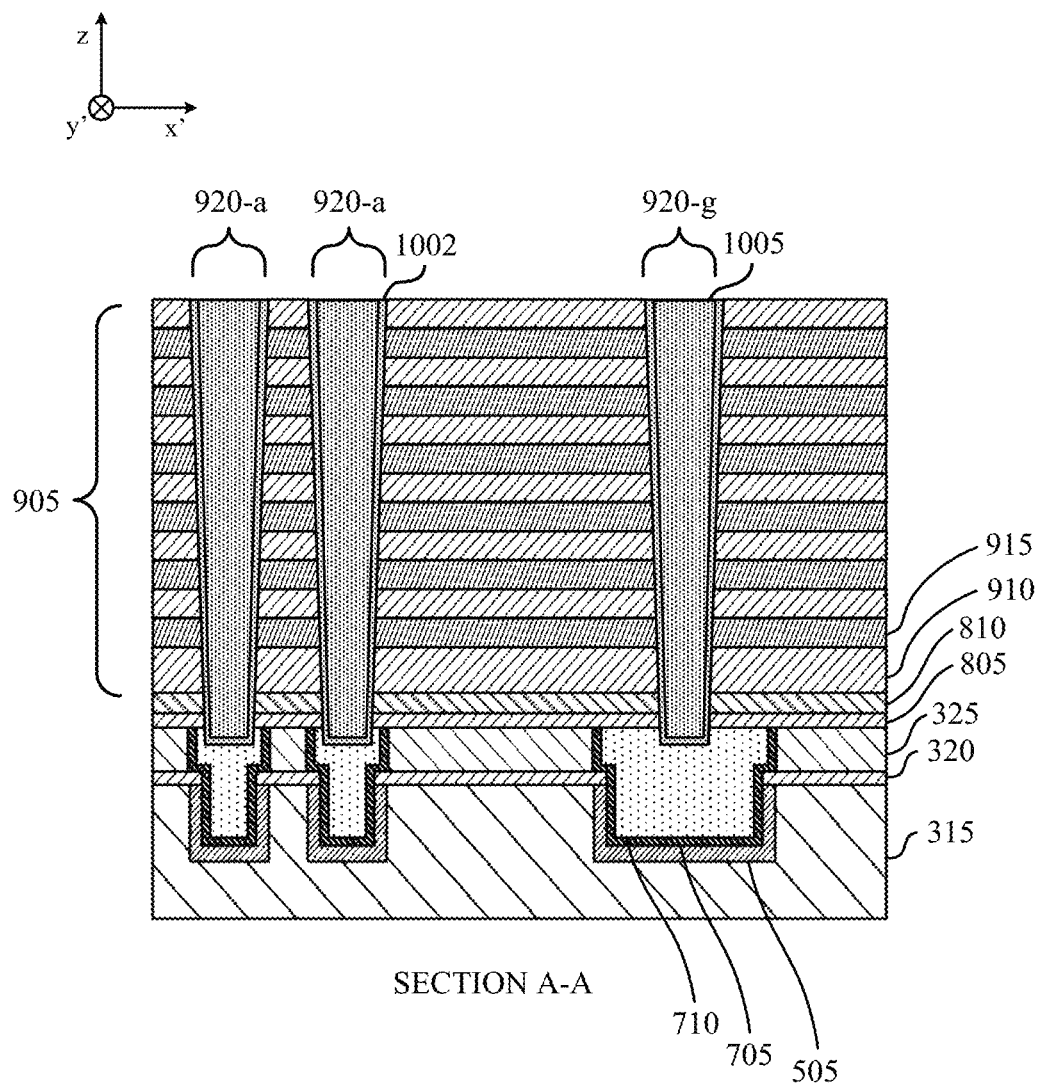

FIG. 10 illustrates the material arrangement 300 (e.g., as a material arrangement 300-*h*) after an eighth set of one or more manufacturing operations, as a cross-sectional side view (e.g., relative to the cut plane A-A). Although FIG. 10 illustrates some features associated with cavities 335-*a* and trenches 340-*c*, such features may be similarly associated with other cavities 335 and other trenches 340 of the material arrangement 300-*h* (not shown).

The eighth set of operations may include operations (e.g., deposition operations) that support filling the cavities 920 (e.g., with a sacrificial material, to support subsequent operations). In some examples, the eighth set of operations may include depositing a material 1005 in the cavities 920. The material 1005 may include a sacrificial material (e.g., sacrificial carbon, or a stack of multiple different materials). In some examples, the eighth set of operations may include depositing a film of material in contact with exposed surfaces (e.g., bottom surface, sidewalls) of the cavities 920 (e.g., a material 1002) before depositing the material 1005, which may include a liner material (e.g., sacrificial material, oxide material, polysilicon material). The eighth set of operations may also include operations (e.g., planarizing operations) to flatten a top surface of the material arrangement 300-*h* (e.g., via CMP), which may support aspects of subsequent operations.

Figure 11:
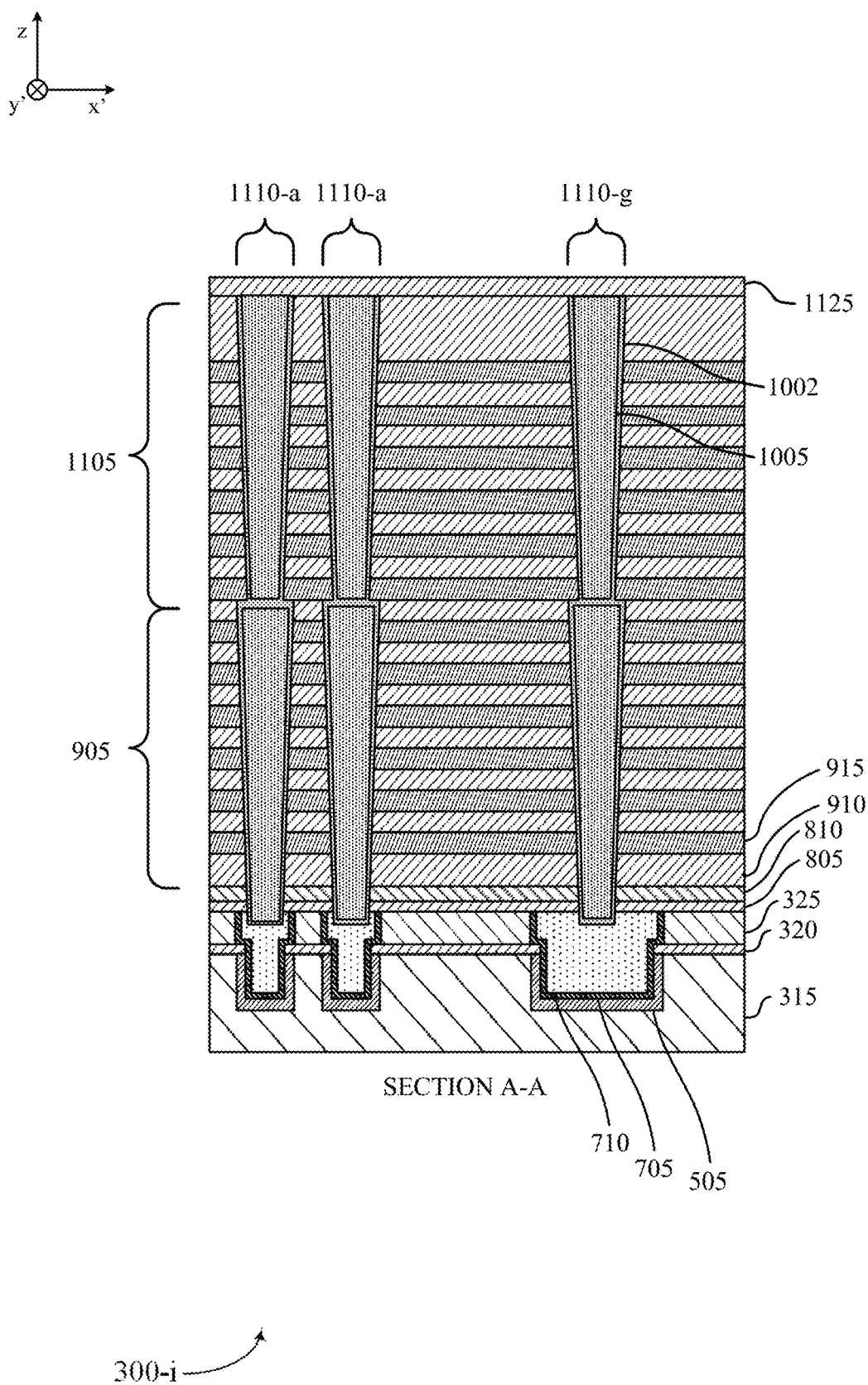

FIG. 11 illustrates the material arrangement 300 (e.g., as a material arrangement 300-*i*) after a ninth set of one or more manufacturing operations, as a cross-sectional side view (e.g., relative to the cut plane A-A). Although FIG. 11 illustrates some features associated with cavities 335-*a* and trenches 340-*c*, such features may be similarly associated with other cavities 335 and other trenches 340 of the material arrangement 300-*i* (not shown).

The ninth set of operations may include operations (e.g., one or more deposition operations, etching operations, photolithography operations) that support depositing additional material layers and forming cavities through the additional material layers (e.g., extending cavities 920). For example, the ninth set of operations may include depositing a stack of layers 1105 (e.g., over the stack of layers 905), where the stack of layers 1105 may include additional alternating layers of the material 910 and the material 915 (e.g., in accordance with alternating material deposition operations).

The ninth set of operations may also include operations (e.g., etching operations, photolithography operations) for forming cavities 1110 through the stack of layers 1105 where forming the cavities 1110 may expose a portion of the material 1005 (e.g., of cavities 920). Like the cavities 920, the cavities 1110 may be formed in different patterns in the different regions of the material arrangement 300-*i*. For example, each cavity 1110 may be aligned with a respective cavity 920 (e.g., in accordance with an alignment tolerance between the seventh set of operations and the ninth set of operations). In some examples, a cavity 1110 may be considered as an extension of a cavity 920, or a cavity 920 and a cavity 1110 may be collectively referred to as a single cavity. Such operations may be another example of forming a plurality of cavities through a stack of material layers, where different subsets of the cavities may support different features of a memory device (e.g., different features of the memory architecture 200).

The ninth set of operations may also include operations (e.g., deposition operations) that support filling the cavities 1110 (e.g., with a sacrificial material, to support subsequent operations). In some examples, the eighth set of operations may include depositing the material 1005 in the cavities 1110. In some examples, the ninth set of operations may include depositing a film of material in contact with exposed surfaces (e.g., bottom surface, sidewalls) of the cavities 1110 (e.g., the material 1002) before depositing the material 1005, which may include a liner material (e.g., sacrificial material, oxide material, polysilicon material). In various examples, depositing the stack of layers 1105, forming the cavities 1110 and depositing the material 1005, may be omitted or may be performed multiple times (e.g., to support more or fewer layers of the material 910 or the material 915, to support smaller openings or other size in an xy-plane of cavities).

The ninth set of operations may also include operations (e.g., oxide deposition operations) that support adding a layer of material over the layers of the material 910 and the material 915 (e.g., over the stack of layers 1105). For example, the ninth set of operations may include depositing a layer of a material 1125 over the layers of the material 910 and the material 915 (e.g., over the stack of layers 1105), where the material 1125 may be a sacrificial barrier layer (e.g., an oxide layer, an oxide of silicon). In some examples, the material 1125 may be the same as the material 910 (e.g., a dielectric material, an oxide of silicon). The material 1125 may support shielding openings of one subset of cavities (e.g., a first subset of cavities 1110) while operations are performed via openings of another subset of the cavities (e.g., a second subset of cavities 1110).

Figure 12:
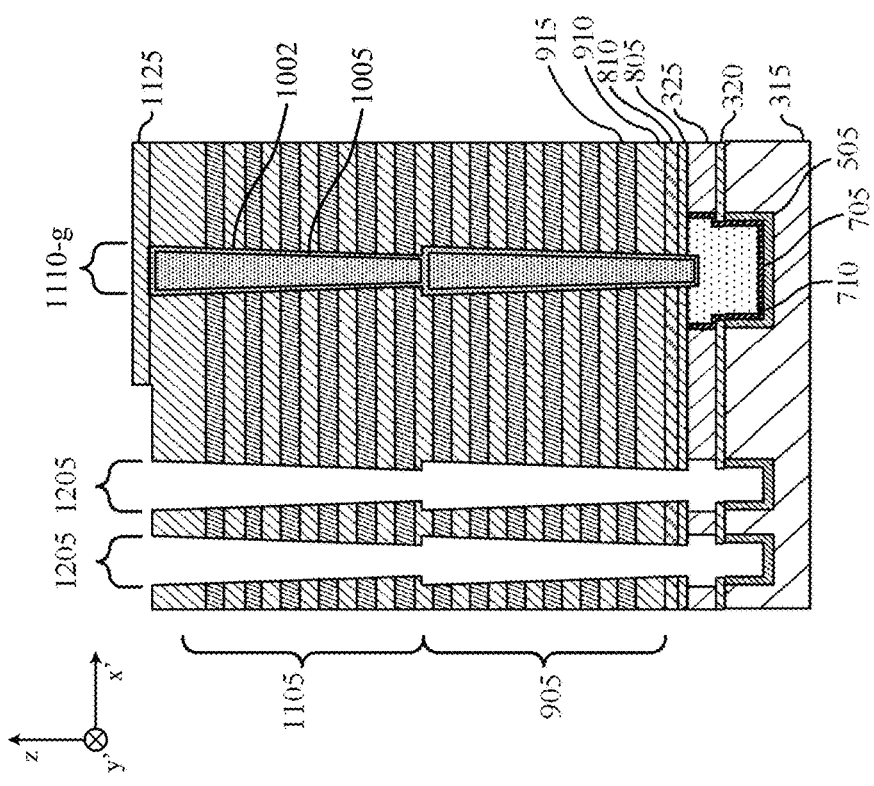

FIG. 12 illustrates the material arrangement 300 (e.g., as a material arrangement 300-*j*) after a tenth set of one or more manufacturing operations, as a cross-sectional side view (e.g., relative to the cut plane A-A). The tenth set of operations may include operations (e.g., photolithography operations, etching operations) that clear cavities for forming various memory structures (e.g., associated with a string 220).

For example, the tenth set of operations may include removing a portion of the layer of material 1125, or both the material 1125 and the material 910, at locations corresponding to a block 210 (e.g., over regions 345, over cavities 335-*a*, over cavities 920-*a*, over cavities 1110-*a*), while leaving other portions of the layer of the material 1125 in place. Removing the material 1125 over such locations may expose a top surface of material 1005 (e.g., at openings of the cavities 1110-*a*), which may support subsequent material removal operations.

The tenth set of operations may also include material removal operations (e.g., etching operations, wet etching operations, exhuming operations) that support forming cavities 1205 (e.g., associated with cavities 1110-*a*, cavities 920-*a*, and cavities 335-*a*, or some combination thereof). For example, the tenth set of operations may include removing exposed portions (e.g., portions exposed based on removing portions of the material 1125, and other selective etching operations of the tenth set of operations) of the material 1005, the material 1002 (e.g., where applicable), the material 710, and the material 705 at locations in the regions 345. Thus, for each cavity 1205, such material removal operations may expose sidewalls of the material 910, the material 915, the material 810, the material 805, the material 325, the material 320, and the material 505 (e.g., an oxidized semiconductor etch stop). In some examples, each cavity 1205 may support the formation of a string of memory cells 205, among other features associated with a string 220.

Figure 13:
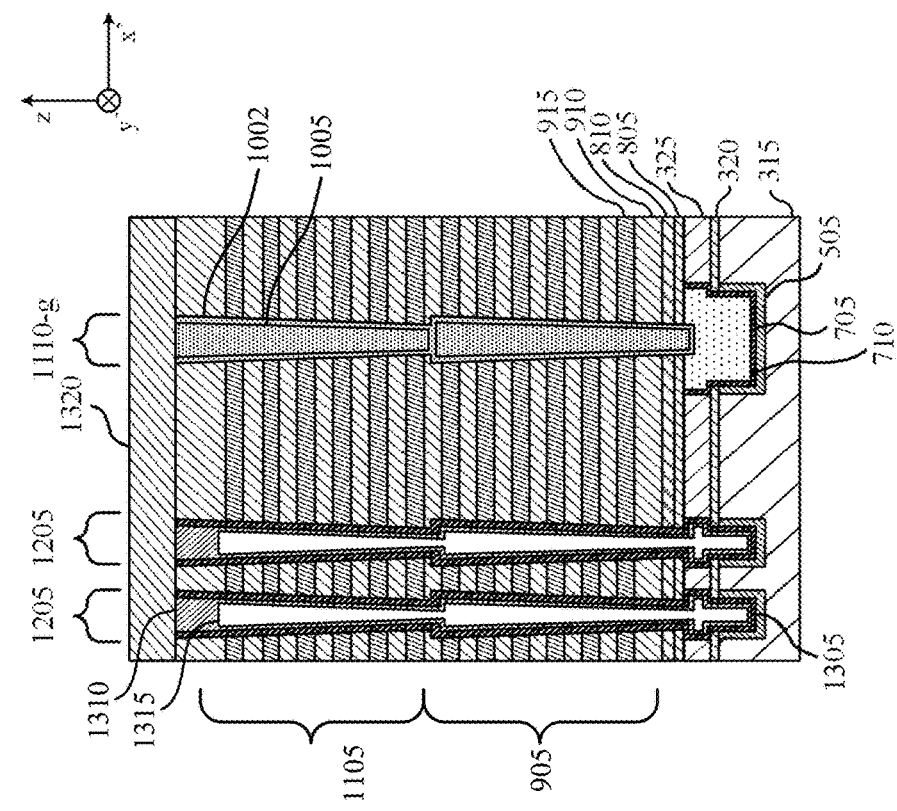

FIG. 13 illustrates the material arrangement 300 (e.g., as a material arrangement 300-*k*) after an eleventh set of one or more manufacturing operations, as a cross-sectional side view (e.g., relative to the cut plane A-A). The eleventh set of operations may include operations (e.g., one or more deposition operations) that support forming a set of memory cells (e.g., memory cells 105, memory cells 205, memory cells of a string 220) in the cavities 1205 (e.g., associated with cavities 920-*a*, associated with cavities 1110-*a*).

For example, the eleventh set of operations may include depositing a material 1305, a material 1310, and a material 1315 in the cavities 1205 to form structures of memory cells 105. The material 1305 may support a charge-trapping function of memory cells 105 and, in various examples, may include one or more layers of material. In some examples, the material 1305 may include a first layer (e.g., a dielectric layer, a first dielectric material, an oxide layer, an oxide of silicon) in contact with walls of each cavity 1205, which may support first dielectric materials 125 of a string of memory cells 105, a second layer (e.g., a charge-trapping layer, a nitride layer, a nitride of silicon) over the first layer, which may support charge trapping structures 120 of the string of memory cells 105, and a third layer (e.g., a dielectric layer, an oxide layer, an oxide of silicon) over the second layer, which may support second dielectric materials 125 of the string of memory cells 105. The material 1310 may be a semiconductor material (e.g., polysilicon, in contact with the material 1305 or third layer thereof), which may support channel portions of the string of memory cells 105 (e.g., between respective first nodes 130 and second nodes 135, a pillar channel). The material 1315 may be a dielectric material (e.g., silicon oxide, in contact with the material 1310) and may fill the remainder of the cavities 1205.

The eleventh set of operations may also include operations (e.g., etching operations, one or more deposition operations) that further support forming a string of memory cells in the cavities 1205. For example, the eleventh set of operations may include removing a portion of the material 1305, a portion of the material 1310, and a portion of the material 1315 (e.g., via recessing, via dry etching) from a top portion of the cavities 1205. In some examples, the material 1315 may be recessed into the cavities 1205, and the material 1310 may then be deposited in the cavities 1205 (e.g., to fill the top portions of the cavities 1205, a plug formation operation). In some examples, the eleventh set of operations may also include operations (e.g., planarizing operations) to flatten a top surface of the material arrangement 300 k (e.g., via CMP), which may include removing portions (e.g., top portions) of the material 1305, the material 1310, the material 1002, the material 1005, the material 910 (e.g., of a top layer of the stack of layers 1105), or a combination thereof. In some examples, the eleventh set of operation may include depositing a material 1320 over the cavities 1205 (e.g., the filled cavities 1205) and the stack of layers 1105 or the additional layers. In some cases, the material 1320 may be the same as the material 910 (e.g., an oxide material, an oxide of silicon).

In some examples, the eleventh set of operations may also include operations that support forming features above the strings of memory cells 205 associated with the cavities 1205 (e.g., for forming transistors 230, for forming select lines 235, for forming bit lines 250, not shown). For example, the eleventh set of operations may include depositing additional material layers (e.g., additional layers of the material 910, additional materials of the material 915, a stack of layers 1340, not shown) and forming cavities through the additional material layers (e.g., extending the cavities 1205, extending the cavities 1110-*a*, extending the cavities 920-*a*). In some examples, one or more materials may be deposited in such cavities to form transistors 230. In some examples, forming such features may be performed prior to depositing the material 1320.

Figure 14A:
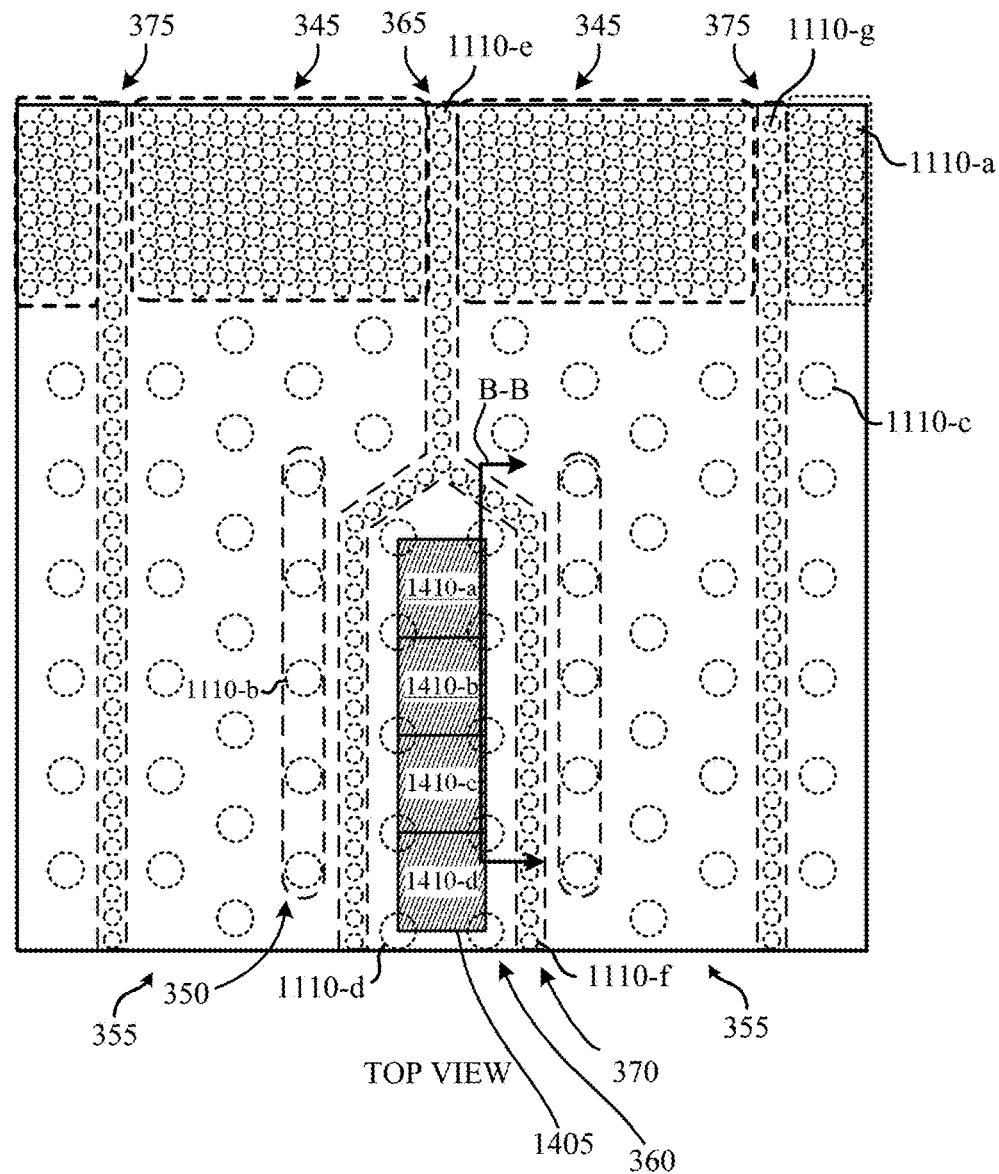
Figure 14B:
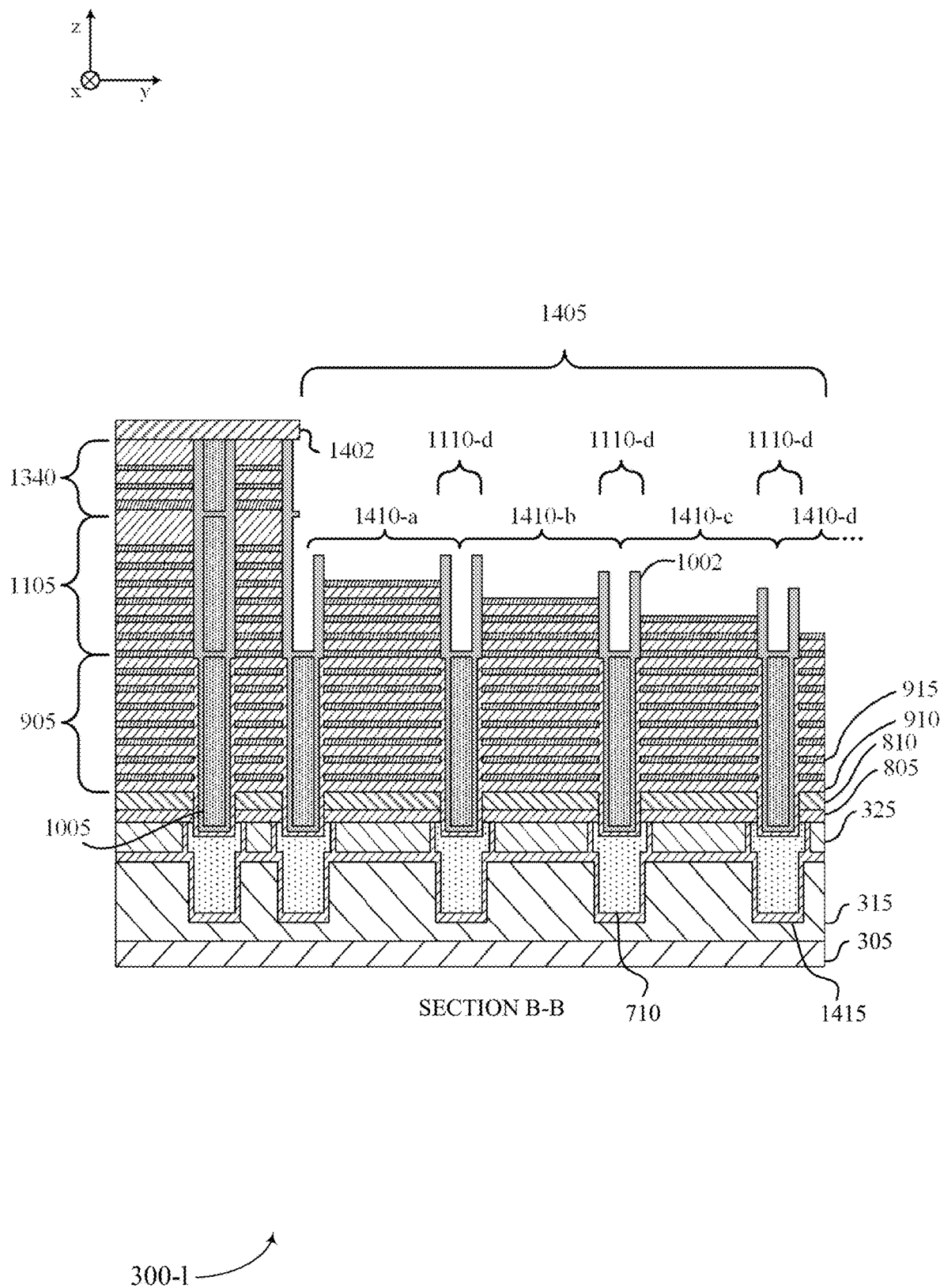

FIGS. 14A and 14B illustrate the material arrangement 300 (e.g., as a material arrangement 300-1) after a twelfth set of one or more manufacturing operations. The twelfth set of operations support forming a sacrificial staircase region associated with the formation of word lines 265 and corresponding electrical connections, and omit aspects of tapering that may be associated with forming cavities. The top view of FIG. 14A illustrates locations of cavities 1110 relative to different regions of the material arrangement 300. For example, cavities 1110-*a* (e.g., cavities 1205) may be included in the regions 345 (e.g., aligned with cavities 335-*a*), cavities 1110-*b* may be included in regions 350 (e.g., aligned with cavities 335-*b*), cavities 1110-*c* may be included in regions 355 (e.g., aligned with cavities 335-*c*), cavities 1110-*d* may be included in regions 360 (e.g., aligned with cavities 335-*d*), cavities 1110-*e* may be included in regions 365 (e.g., aligned along trenches 340-*a*), cavities 1110-*f* may be included in regions 370 (e.g., aligned along trenches 340-*b*), and cavities 1110-*g* may be included in regions 375 (e.g., aligned along trenches 340-*c*). Although such relationships are illustrated with reference to cavities 1110, such relationships also may be applicable to cavities 920, or combined cavities thereof, among other features.

In some examples, the twelfth set of operations may include depositing a material 1402 over the material arrangement 300-*k*. For example, the material 1402 may be deposited over a stack of layers 1340, or other materials present before performing the twelfth set of operations. The material 1402 may be deposited over the cavities 1110 (e.g., over the cavities 1205) in each of the regions 345, 350, 355, 360, 365, 370, and 375. The material 1402 may include a dielectric material (e.g., an oxide, an oxide of silicon), which may be the same as other materials of the material arrangement 300 (e.g., material 805, material 910, material 1125, material 1320). In the example of material arrangement 300-1, for the sake of simplification of illustration, the material 1415 may be illustrative of a combination of the material 320, the material 505, and the material 705, among other materials or combinations of materials.

The twelfth set of operations may also include operations (e.g., etching operations, dry etching operations) that support forming a staircase 1405 (e.g., a staircase pattern) in the region 360. For example, the twelfth set of operations may include removing portions of the materials in the region 360 (e.g., material 1402, material 910, material 915, material 1002, material 1005) in a sequence of material removal operations to expose the material 910 and the material 915 in accordance with different levels 1410, where each level 1410 may be associated with a different dimension (e.g., height) of the material arrangement 300 along the z-direction (e.g., representing a different depth of material removal along the z-direction). Each level 1410 may be associated with a top surface of a respective layer of the material 915 (e.g., in an xy-plane) and exposed sidewalls of respective layers of the material 910 and the material 915 (e.g., in an xz-plane, in a yz-plane). Thus, forming the staircase 1405 may expose sidewalls of the stack of layers 905 and the stack of layers 1105 (and the stack of layers 1340, where applicable), where different quantities of layers of the material 910 and layers of the material 915 are exposed by the formation of the staircase 1405 and in accordance with the levels 1410. In some examples, corners of each level 1410 may be coincident with features associated with cavities 1110-*d*, cavities 920-*d*, or cavities 325-*d*, and material removal operations may include partially removing materials deposited in such cavities (e.g., partially removing corresponding portions of material 1002 or material 1005, a relatively imprecise etching of portions of the material arrangement 300 that will be isolated from active portions of the material arrangement 300). Although four levels 1410 are illustrated, the material arrangement 300 may include any quantity of levels 1410 in the staircase 1405, such as at least one level 1410 per page 215 in a given block 210 (e.g., at least one level 1410 per word line 265), among other configurations.

Figure 15A:
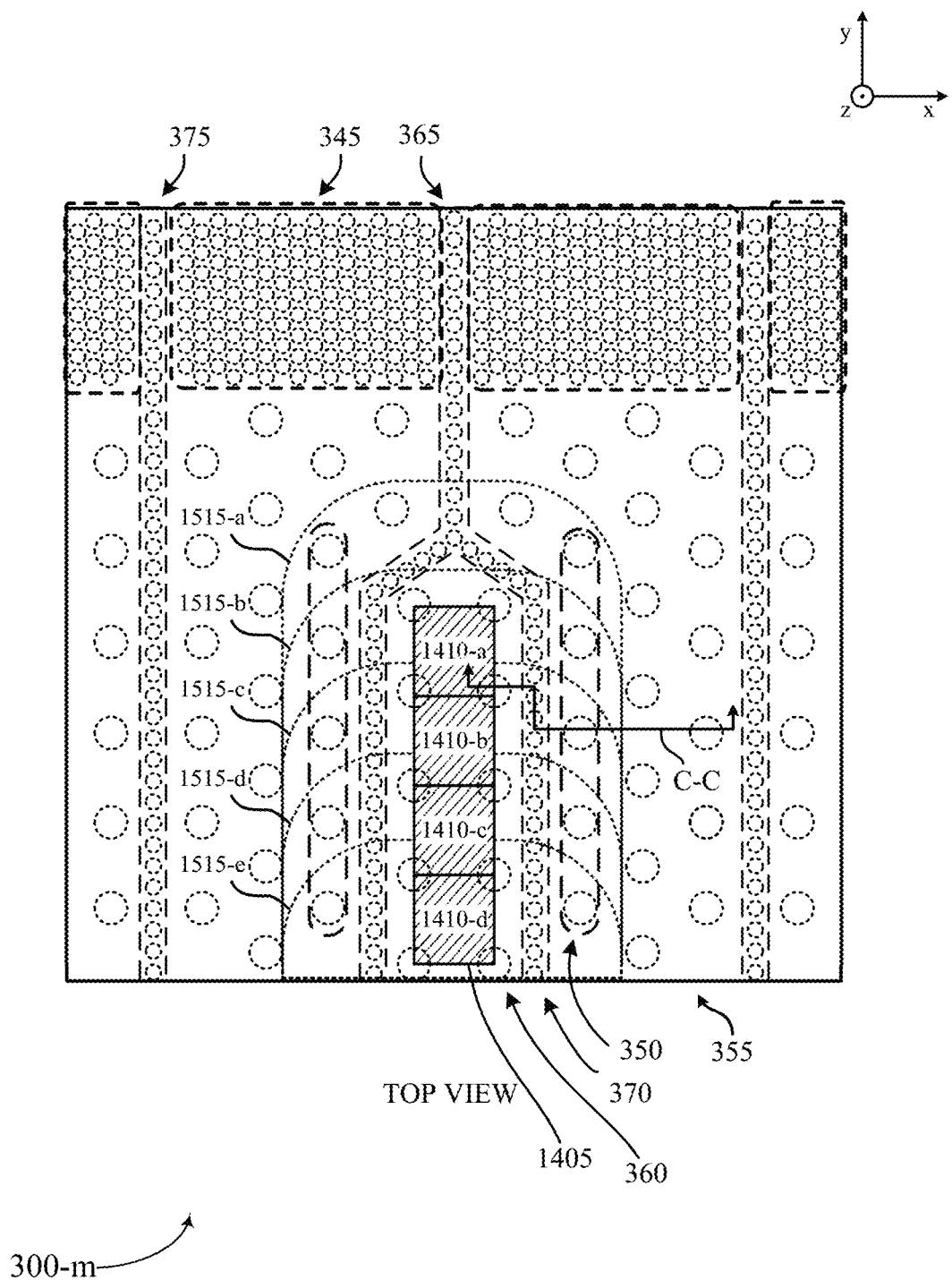
Figure 15B:
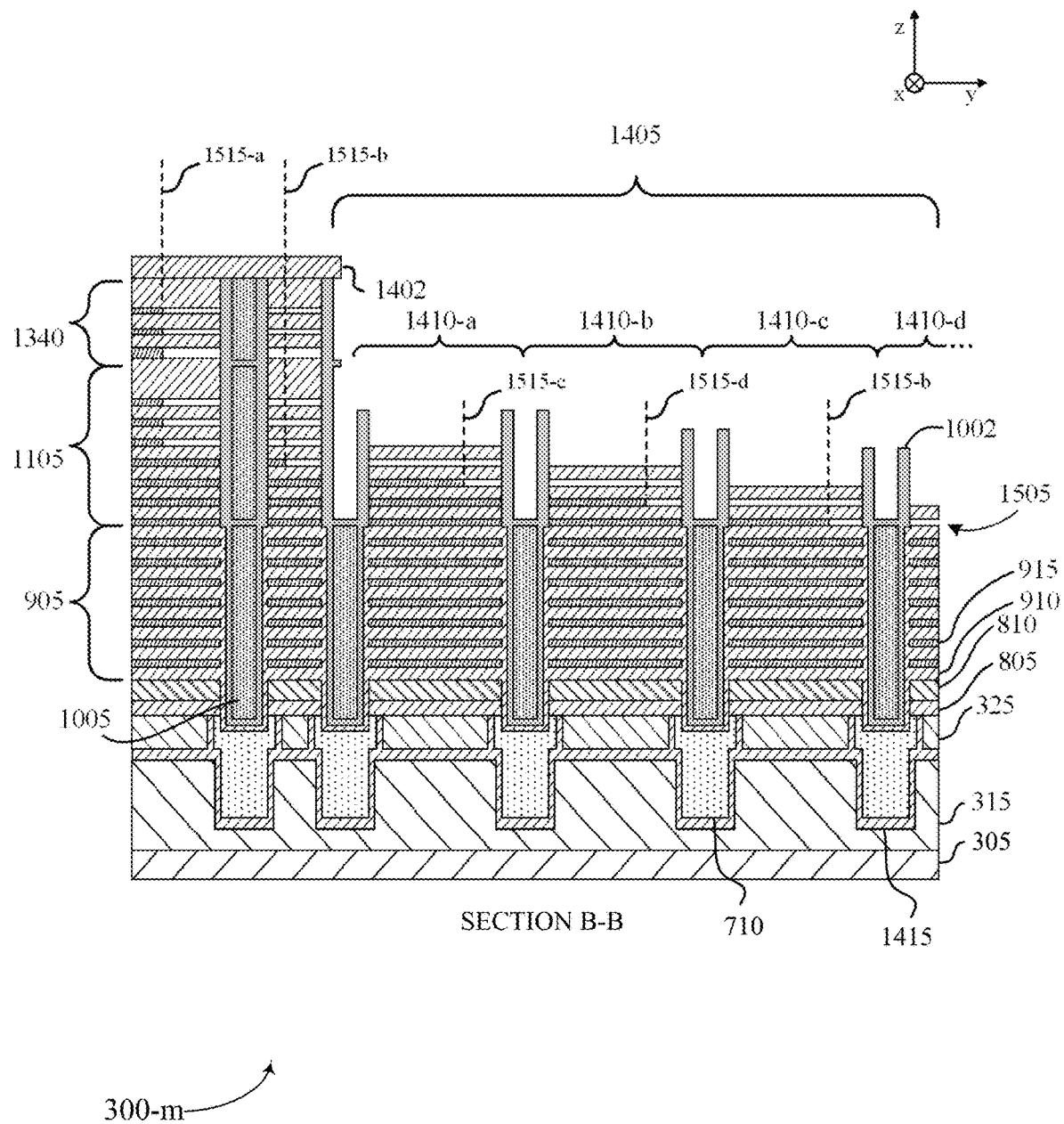
Figure 15C:
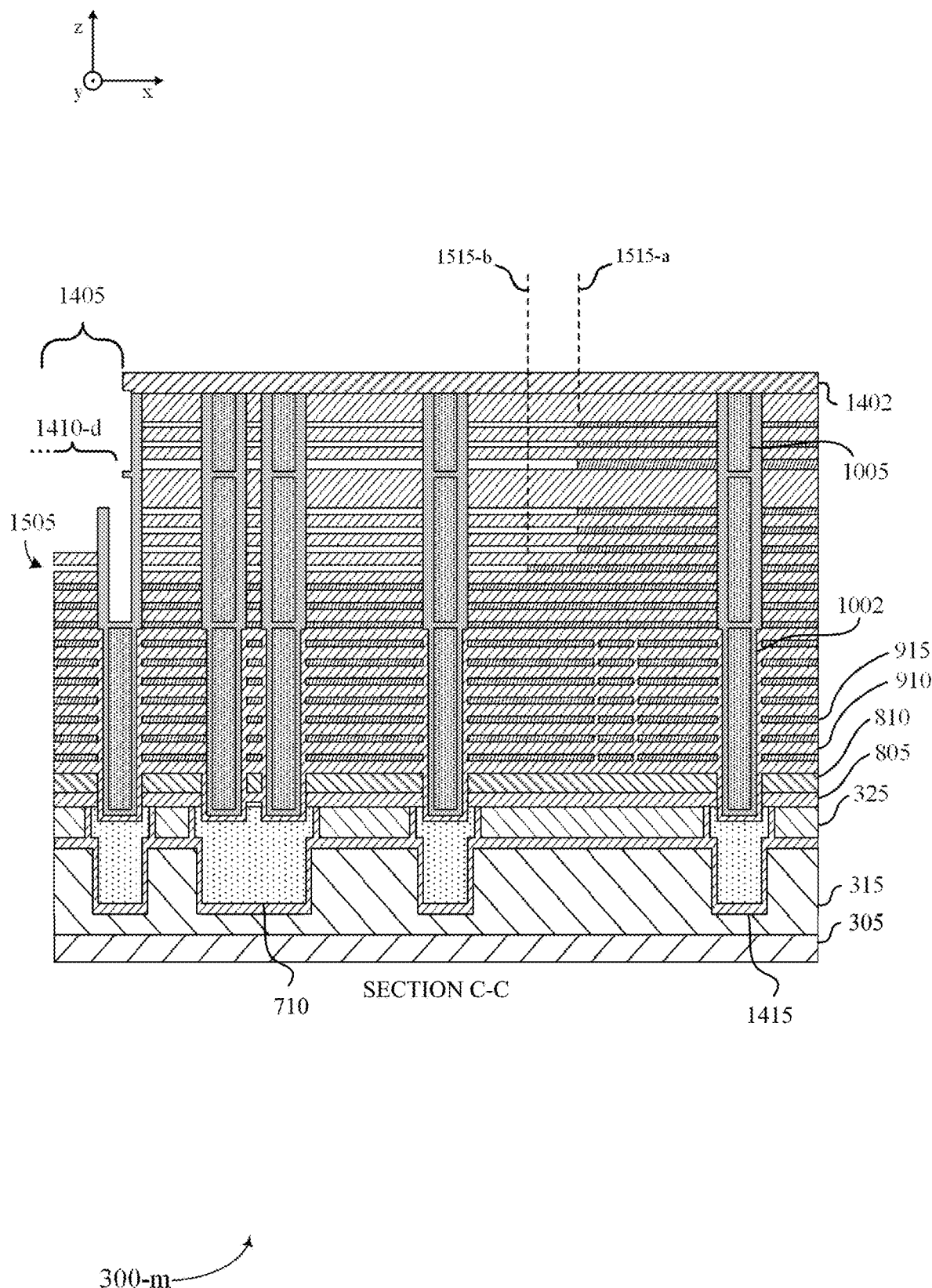

FIGS. 15A, 15B, and 15C illustrate the material arrangement 300 (e.g., as a material arrangement 300-*m*) after a thirteenth set of one or more manufacturing operations. The thirteenth set of operations may include operations (e.g., etching operations, wet etching operations, exhuming operations) that supports forming voids 1505 (e.g., first voids). For example, the thirteenth set of operations may include removing exposed portions of the material 915 from top surfaces of the levels 1410 and from between layers of the material 910 to boundaries 1515 (e.g., associated with sidewalls of the material 915), which may have locations respective to each level 1410. For example, a boundary 1515-*a* may be associated with a distance (e.g., in an xy-plane, a radial distance) from a combined area (e.g., in an xy-plane) of levels 1410-*a* through 1410-*d* (and other levels 1410 associated with the material arrangement 300), a boundary 1515-*b* may be associated with a distance from a combined area of levels 1410-*b* through 1410-*d* (and other levels 1410 associated with the material arrangement 300), and so on. In some examples, such a distance may be measured from exposed sidewalls of the material 910 and the material 915 associated with respective levels 1410 of the staircase 1405, and such a distance may be related to a rate of removal of the material 915 and a duration of material removal associated with the thirteenth set of operations. Thus, each of the voids 1505 may have a respective distance of projection into regions 355 and regions 350, such that each cavity 1110-*b* or 920-*b* of a region 355 may have a lowest void 1505 (e.g., along the z-direction) at a respective level 1410, which may support forming electrical connections with a respective word line 265 for each page 215 of each block 210. Moreover, each of the voids 1505 may remain underneath (e.g., along the z-direction) a portion of the material 1402, which may support relatively precise formation of features (e.g., word lines 265) in the material arrangement 300.

Figure 16:
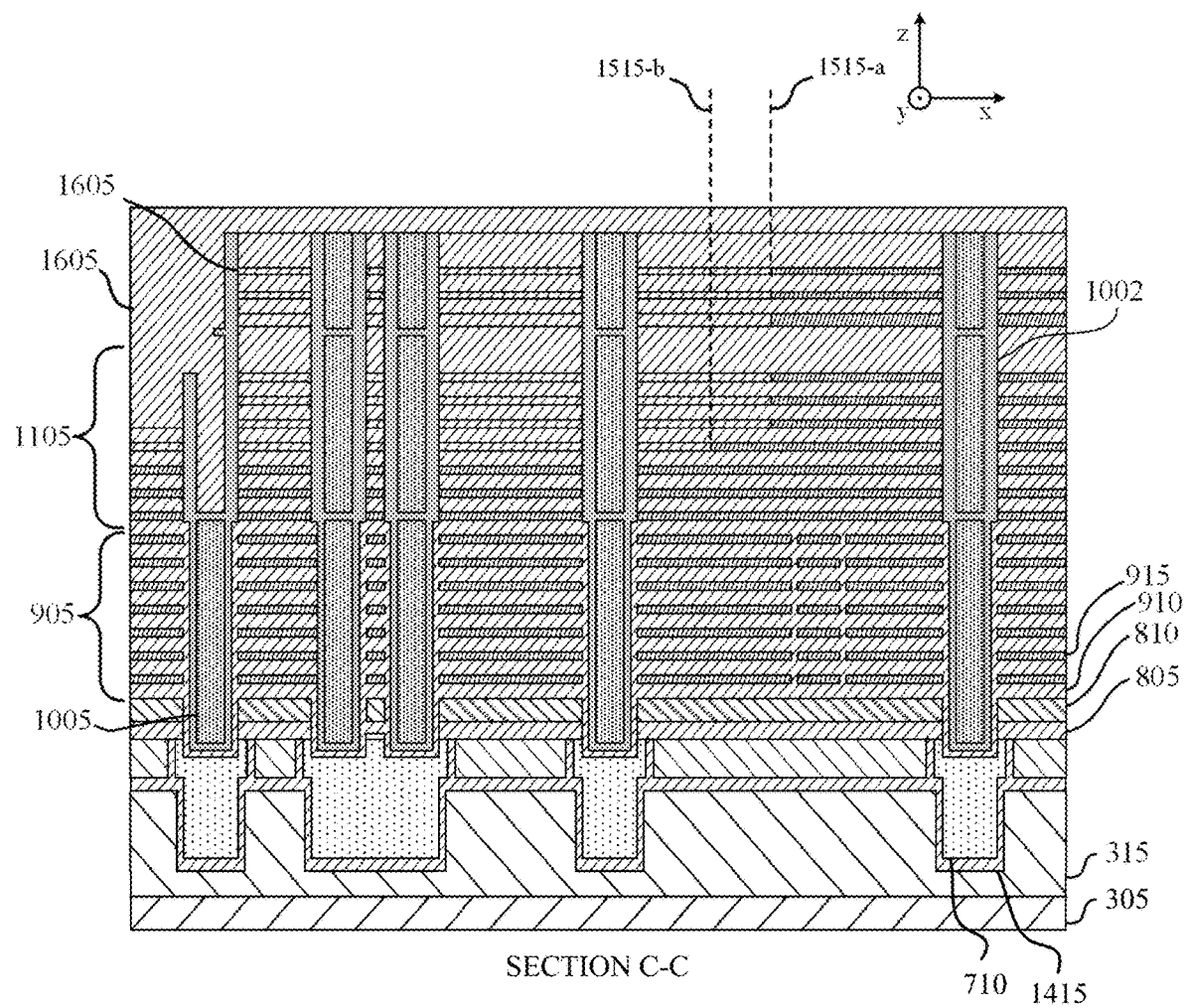

FIG. 16 illustrates the material arrangement 300 (e.g., as a material arrangement 300-*n*) after a fourteenth set of one or more manufacturing operations, as a cross-sectional side view (e.g., relative to the cut C-C). The fourteenth set of operations may include operations (e.g., oxide deposition operations) that supports depositing dielectric material in the voids 1505 and to fill the staircase 1405. For example, the fourteenth set of operations includes depositing a material 1605 in the voids 1505 and in the staircase 1405. The material 1605 may be a dielectric material (e.g., a second dielectric material, an oxide material), which may be the same as the material 910, among other materials of the material arrangement 300. At various levels of the material arrangement 300 (e.g., between layers of the material 910), portions of the material 1605 may have sidewalls associated with the boundaries 1515 (e.g., sidewalls of the material 1605 in contact with sidewalls of the material 915), which may support forming word lines 265, and electrical contacts with such word lines 265 in subsequent operations.

Figure 17A:
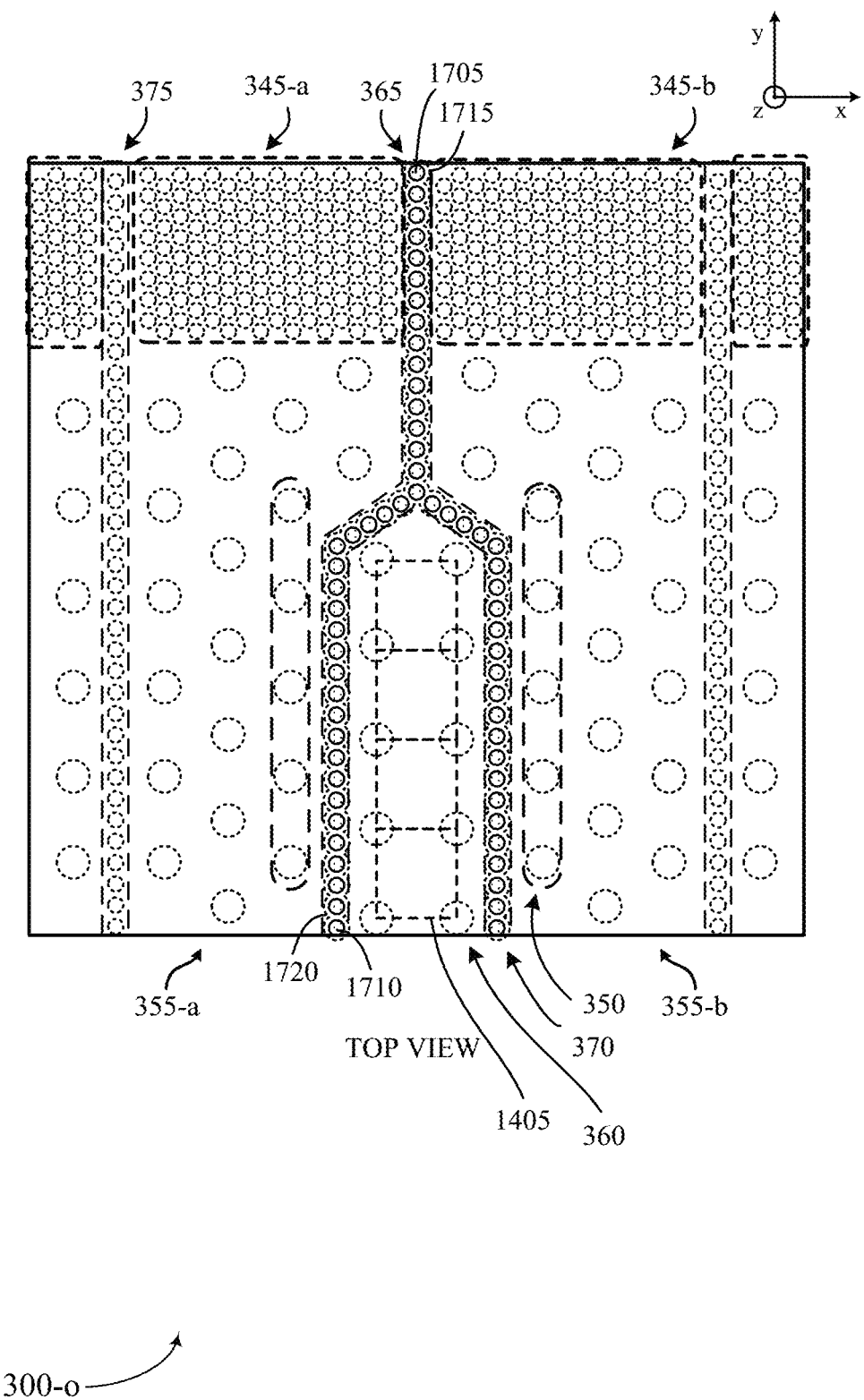
Figure 17B:
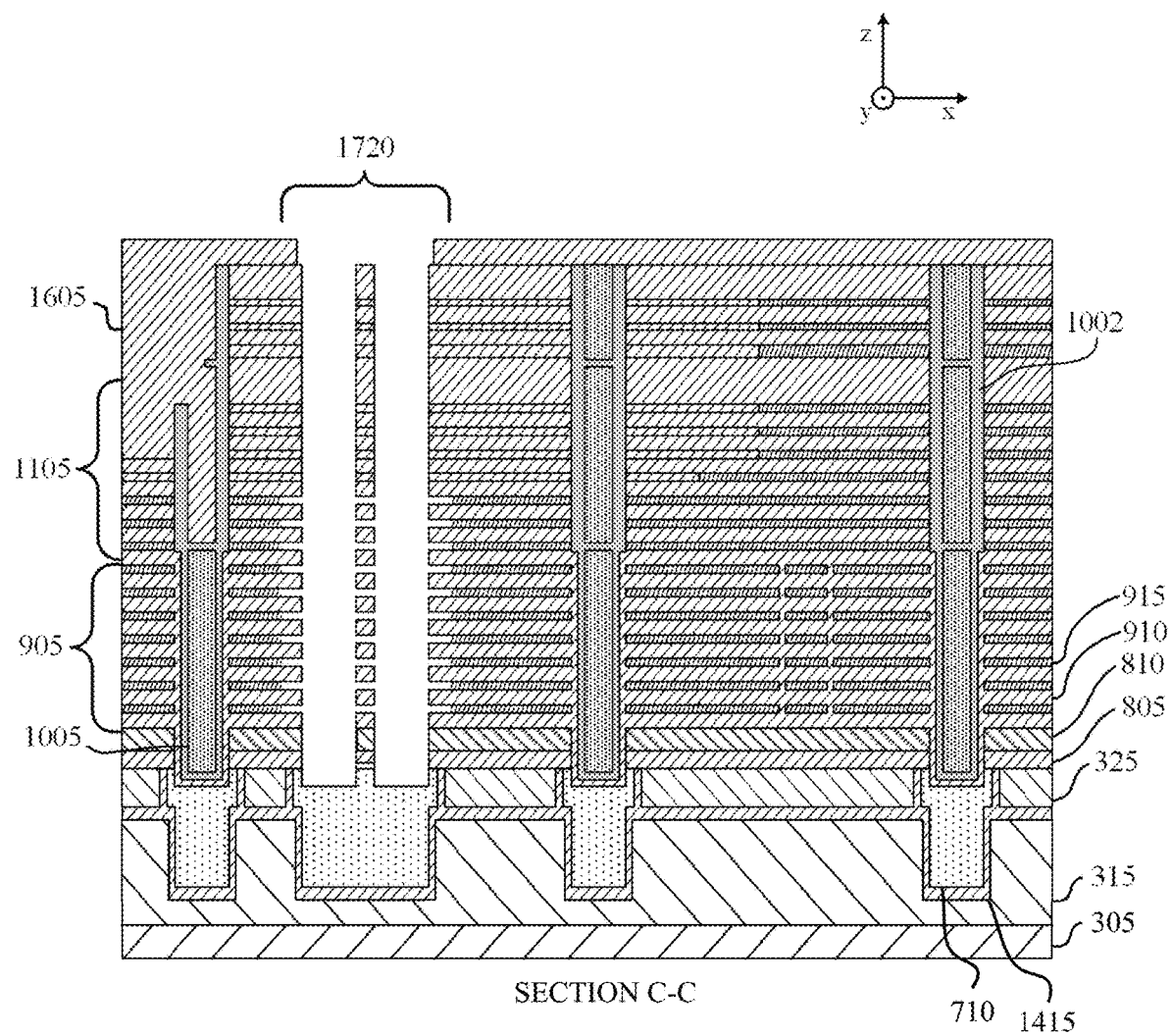

FIGS. 17A and 17B illustrates the material arrangement 300 (e.g., as a material arrangement 300-*o*) after a fifteenth set of one or more operations. The fifteenth set of operations may include operations (e.g., photolithography operations) that clear cavities for forming isolation regions (e.g., an isolation region, a third isolation region). For example, the fifteenth set of operation may include exposing features associated with the cavities 920-*e*, 920-*f*, 1110-*e*, and 1110-*f*, or any combination thereof (e.g., by removing portions of material 1125, material 1402, or material 1605, where applicable) at locations corresponding to regions 365 and regions 370 (e.g., over the trenches 340-*a* and 340-*b*). Such material removal may expose a top surface of a material 1005 (e.g., at openings of the cavities 1110-*e* and 1110-*f*) which may support subsequent material removal operations.

The fifteenth set of operations may also include material removal operations (e.g., etching operations, wet etching operations, exhuming operations that supports forming cavities 1705 in the regions 365 (e.g., clearing cavities 920-*e* and 1120-*e*, forming or opening a third subset of cavities) and cavities 1710 (e.g., clearing cavities 920-*f* and 1120-*f*, forming or opening a sixth subset of cavities) in the regions 370. For example, the fifteenth set of operations may include removing exposed portions of the material 1002 and the material 1005 at locations in the regions 365 and the regions 370. In some examples, for each cavity 1705 and for each cavity 1710, such material removal operations may expose sidewalls of the material 910, the material 915, and the material 1605.

The fifteenth set of operations may include further material removal operations (e.g., etching operations, wet etching operations, recessing operations) that support forming isolation regions associated with the cavities 1705 and the cavities 1710. In some examples, the fifteenth set of operations may include removing (e.g., etching, exhuming) at least exposed portions of the material 915 via the cavities 1705 and 1710, which may remove the material 915 from between the cavities 1705 and 1710 (e.g., to form isolation regions 1715 and 1720, respectively). In some examples (e.g., as illustrated in FIG. 17B), portions of the material 910 may remain in place across the isolation regions 1715 or 1720 (e.g., where the material 915 is removed between layers of the material 910 to form voids between the layers of the material 910 along the z-direction), and such portions of the material 910 may provide structural support across the isolation regions 1715 and isolation regions 1720. In some other examples (not shown), the cavities 1705 and 1710 may be enlarged (e.g., enlarged in cross-section in an xy-plane, by implementing an etch process that removes both the material 910 and the material 915) such that cavities 1705 and 1710 are merged to form isolation regions 1715 and 1720, respectively, as trenches. In some examples, an isolation region 1715 may form an electrical isolation between a subset of memory cells 205 in a region 345-*a* and a second subset of memory cells 205 in a region 345-*b*. In some examples, one or more isolation regions 1720 may enclose (e.g., as viewed in an xy-plane) a region 360, which may isolate relatively imprecise features formed in the region 360 from an active region of the material arrangement 300. In some examples, isolation regions 1715 and 1720 may be coincident (e.g., forming a common or joined isolation region, isolating one active portion of the material arrangement 300 from another active portion).

Figure 18A:
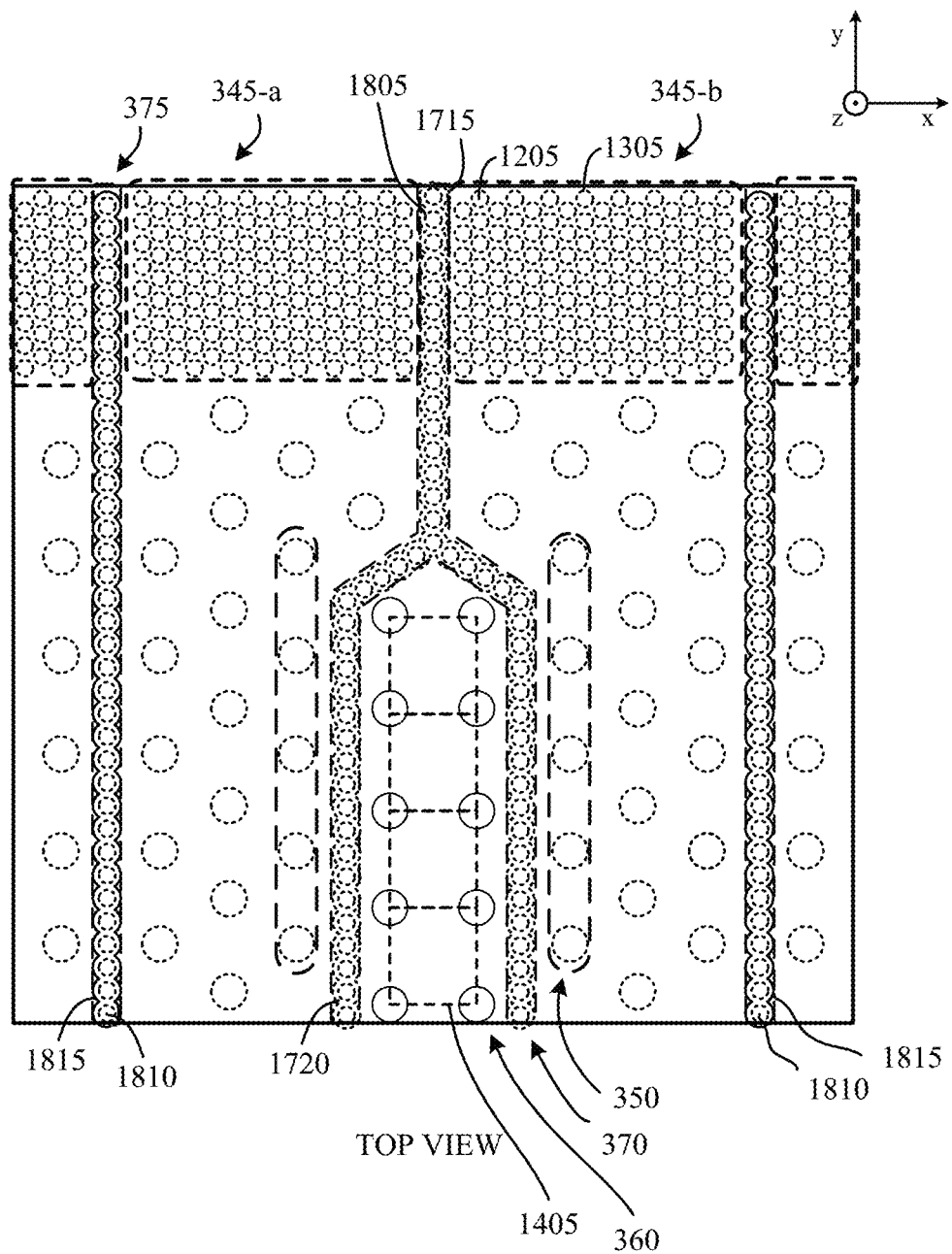
Figure 18B:
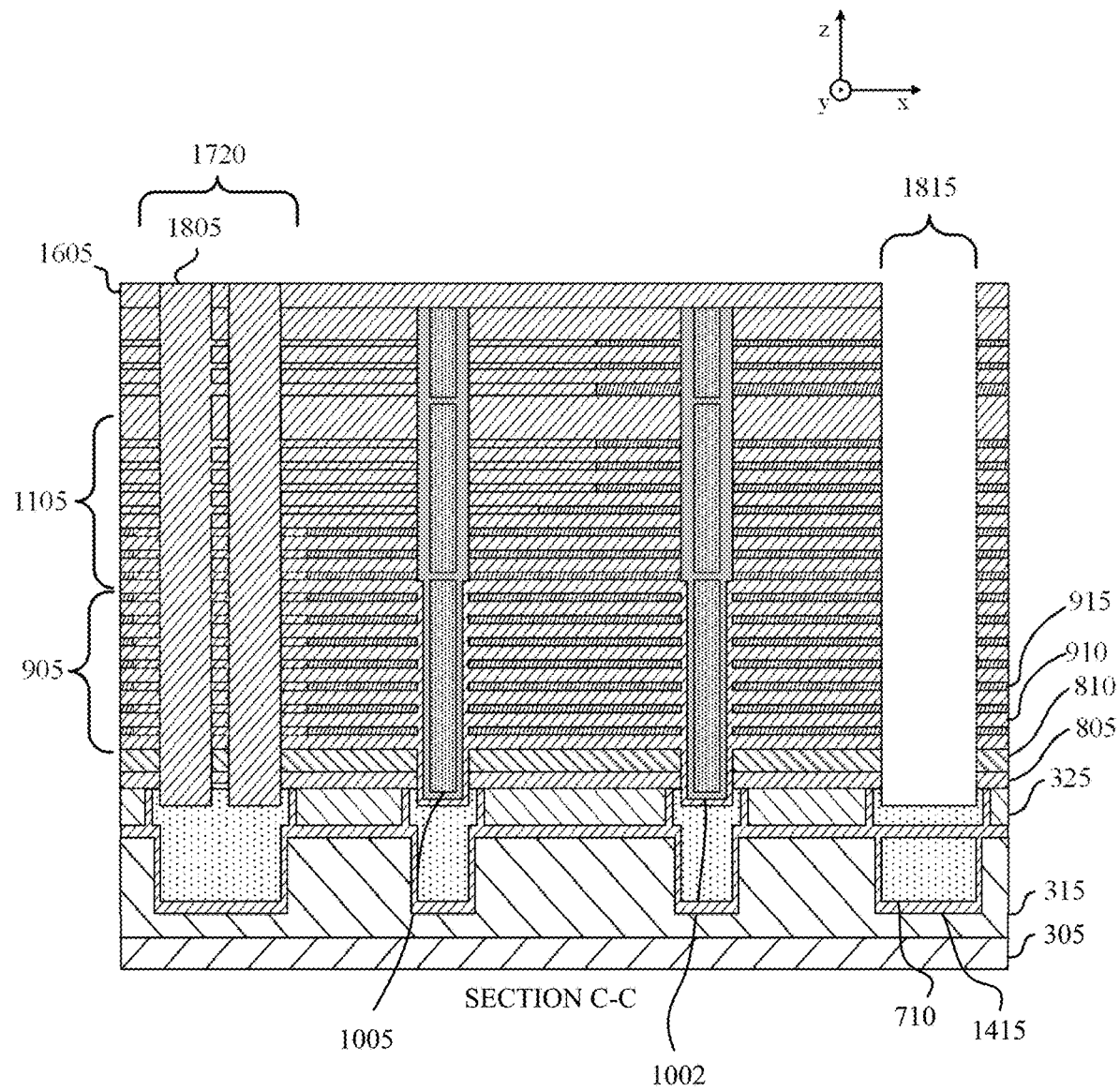

FIGS. 18A and 18B illustrates the material arrangement 300 (e.g., as a material arrangement 300-*p*) after a sixteenth set of one or more operations. The sixteenth set of one or more operations may include operations (e.g., oxide deposition operations) that further supports forming the third isolation region and the isolation region. For example, the sixteenth set of operations may include depositing a material 1805 in the isolation regions 1715 and the isolation regions 1720. The material 1805 may be a dielectric material (e.g., a fourth dielectric material, a fifth dielectric material, an oxide material), which may be the same as the material 910, among other materials of the material arrangement 300. The material 1805 may support an electrical isolation between regions of the material arrangement 300. For example, the material 1805 in the isolation regions 1715 may provide an isolation between array regions (e.g., regions 345) and the material 1805 in the isolation regions 1720 may isolate the staircase regions (e.g., regions 360) from active regions of the material arrangement (e.g., regions 355).

The sixteenth set of operations may also include operations (e.g., photolithography operations) that clear cavities for forming isolation regions (e.g., a second isolation region). For example, the sixteenth set of operation may include exposing features associated with the cavities 920-*g* or 1110-*g*, or any combination thereof (e.g., by removing portions of material 1125, material 1402, or material 1605, where applicable) at locations corresponding to regions 375 (e.g., over the trenches 340-*c*). Such material removal may expose a top surface of a material 1005 (e.g., at openings of the cavities 1110-g) which may support subsequent material removal operations.

The sixteenth set of operations may also include material removal operations (e.g., etching operations, wet etching operations, exhuming operations that supports forming cavities 1810 in the regions 375 (e.g., clearing cavities 920-g and 1120-g, forming or opening a third subset of cavities). For example, the sixteenth set of operations may include removing exposed portions of the material 1002 and the material 1005 at locations in the regions 375. In some examples, for each cavity 1810, such material removal operations may expose sidewalls of the material 910, the material 915, and the material 1605.

The sixteenth set of operations may include further material removal operations (e.g., etching operations, wet etching operations, recessing operations) that support forming isolation regions associated with the cavities 1810. For example, the cavities 1810 may be enlarged (e.g., enlarged in cross-section in an xy-plane, by implementing an etch process that removes both the material 910 and the material 915) such that cavities 1810 are merged to form isolation regions 1815 as trenches. In some examples, isolation regions 1815 may form an electrical isolation between one active region of the material arrangement 300 and another.

Figure 19:
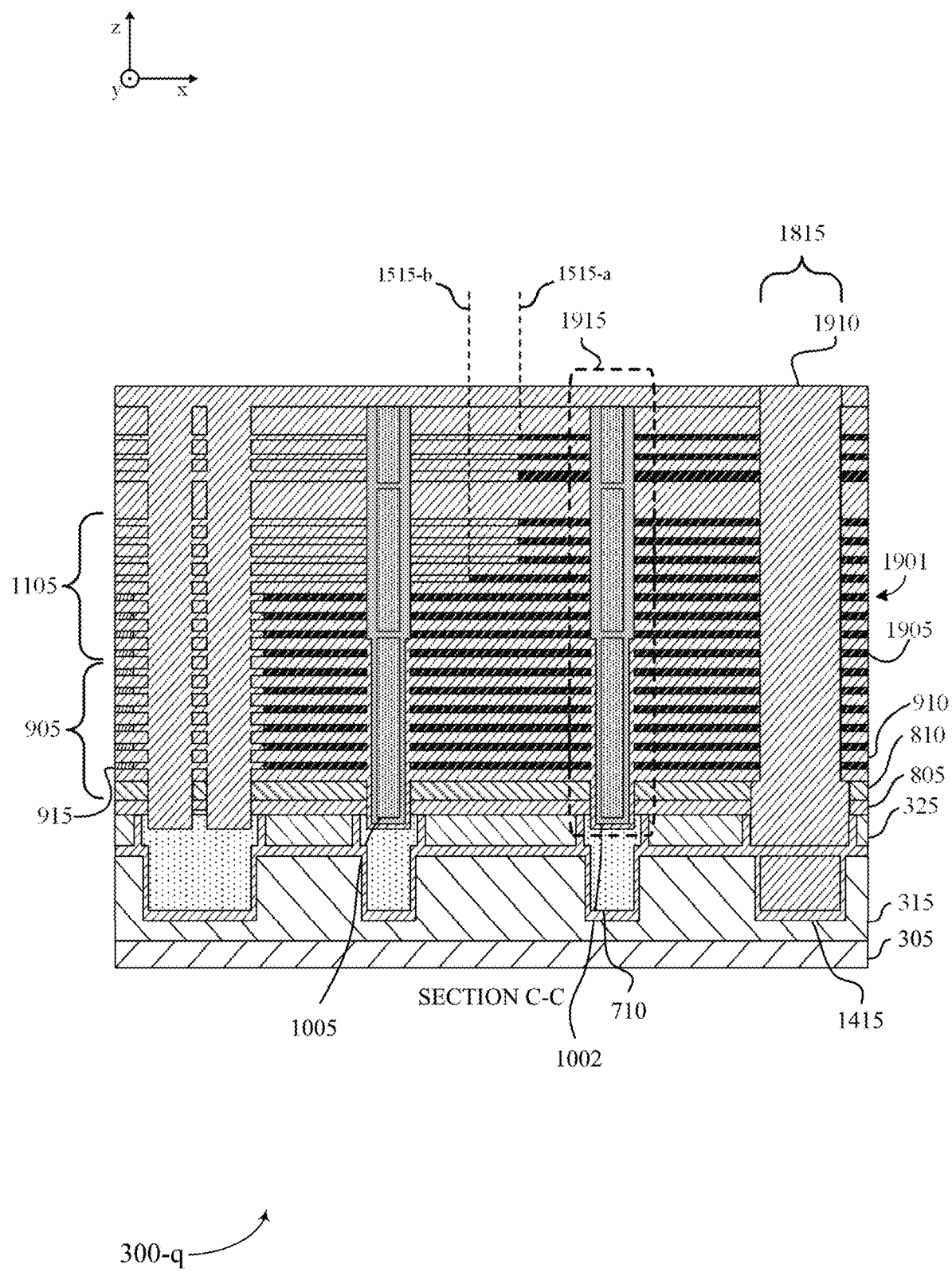

FIG. 19 illustrates the material arrangement 300 (e.g., as a material arrangement 300-q) after a seventeenth set of one or more operations, as a cross-sectional side view (e.g., relative to the cut C-C). The seventeenth set of operations may include operations various operations that support forming contacts (e.g., lateral contacts) and word lines 265 in the material arrangement 300.

In some examples, the seventeenth set of operations may include depositing a liner material (not shown) on exposed surfaces (e.g., walls) of the isolation regions 1815. In various examples, the liner material may include one or more layers of material. For example, the liner material may include a first layer of a nitride (e.g., a nitride of silicon) in contact with exposed sidewalls (e.g., of the material 910 and the material 915) of the isolation regions 1815, a layer of an oxide (e.g., an oxide of silicon) in contact with the first layer, a second layer of nitride in contact with the layer of oxide, and a layer of polysilicon, among other examples. In some examples, the seventeenth set of operations may also include a material removal operation (e.g., etching operations, dry etching operations) that support forming features in the isolation regions 1815, where a portion of the liner material is removed from the isolation regions 1815 (e.g., from a bottom of the trenches, opposite from openings of the isolation regions 1815).

In some examples, the seventeenth set of operations may include operations (e.g., etching operations, wet etching operations, exhuming operations) that support forming voids via the isolation region 1815 (e.g., into regions 345 and regions 355). For example, the seventeenth set of operations may include forming voids by removing the material 710 and portions of the material 1415 (e.g., portions of the material 1415 associated with the material 705) via the isolation regions 1815 (e.g., via openings of the isolation regions 1815). In some examples, removing the material 710 and portions of the material 1415 may expose surfaces of the material 325.

In some examples, the seventeenth set of operations may include operations (e.g., etching operations, wet etching operations, exhuming operations) that further support forming voids via the isolation regions 1815. For example, the seventeenth set of operations may include extending the voids between a layer of the material 1415 and a layer of the material 805 (e.g., in the regions 345 and regions 355) by removing the material 325 (e.g., via openings of the isolation regions 1815). Removing the material 325 may expose surfaces of the material 1305 (e.g., of the strings 220).

In some examples, the seventeenth set of operations may include further operations (e.g., etching operations, wet etching operations, exhuming operations) that support forming features in at least the regions 345. For example, the seventeenth set of operations may include removing portions of the material 325 (e.g., a lateral contact polysilicon removal) the material 805 (e.g., a lateral contact oxide removal), and the material 1305 (e.g., a lateral contact storage nitride removal) that are exposed via openings of the isolation regions 1815, which may extend the voids (e.g., along the x-direction and y-direction) in at least the regions 345. Removing portions of the material 325, the material 1305, the material 320, and the material 805 may expose a surface of the material 1310 (e.g., a channel polysilicon to support forming transistor structures, such as transistors 240) in the regions 345.

In some examples, the seventeenth set of operations may include operations (e.g., a doped polysilicon deposition operation) that support forming various features of the memory architecture 200 (e.g., transistors 240). For example, the seventeenth set of operations may include depositing a semiconductor material (not shown) via openings of the isolation regions 1815, which may include depositing the semiconductor material in contact with the material 1310, the material 810, and the material 315 (e.g., to form a source contact for transistors 240, to form a channel between memory cells 205 of a string 220 and the layer of material 305, not shown). The seventeenth set of operations may include an etch-back operation to isolate different portions of the semiconductor material from each other, such as separate portions of the semiconductor material in the region of blocks 210 (e.g., cavities 335, cavities 925, cavities 1115) and in the isolation regions 1815 (e.g., at the bottom of the trenches in the isolation regions 1815). In some examples, the twentieth set of operations may also include removing the liner material from the isolation regions 1815 (e.g., in a wet etching operation, a liner removal operation). The seventeenth set of operations may also include a semiconductor oxidizing operation to form additional portions of the material 505 (e.g., an oxide, an oxide of silicon), which may act as an etch stop (e.g., a wet etch barrier).

In some examples, to support forming word lines 265, the seventeenth set of operations may include material removal operations (e.g., etching operations, exhuming operations) that support forming voids 1901 (e.g., second voids). The voids 1901 may be formed between layers of the material 910 by removing the material 915 from the stack of layers 905 and the stack of layers 1105 (e.g., via the isolation region 1815, via cavities 1810). Forming the voids 1901 may expose portions (e.g., sidewalls) of the material 1605 between layers of the material 910, which may correspond to locations along boundaries 1515 (e.g., where the boundaries 1515 also may illustrate a boundary of the voids 1901. Thus, the voids 1901 may have different extents (e.g., in an xy-plane) at different levels (e.g., along the z-direction) of the material arrangement 300.

Forming the voids 1901 may expose portions (e.g., sidewalls) of the material 1002 (e.g., between layers of the material 910), and other portions of the material 1002 may remain in contact with the material 910 and support the material 910 across the voids (e.g., along the z-direction) for the formation of word lines 265, among various structures of the memory architecture 200. Accordingly, portions of the material 1002 and the material 1005 (e.g., associated with cavities 335-c, cavities 920-c, cavities 1110-c, in the regions 355) may be an example of structural pillars 1915 that support portions of the material arrangement 300 (e.g., layers of the material 910) during operations to form the material arrangement 300.

The seventeenth set of operations may also include operations (e.g., one or more deposition operations, metal fill operations, etching operations) that support forming word lines 265 between layers of the material 910. For example, the seventeenth set of operations may include depositing a material 1905 in the voids 1901, which may include one or more layers of material. For example, the seventeenth set of operations may include depositing a first material in contact with the material 1305, which may also be formed along surfaces of the material 910, among other exposed surfaces of the material arrangement 300. In some examples, the first material may support a dielectric function of memory cells 205 (e.g., as a dielectric material 125). Additionally, or alternatively, the material 1905 may include one or more conductive materials (e.g., first conductive materials, third materials), such as tungsten, to form word lines 265. The layers of the material 1905 (e.g., fourth layers) may overlap (e.g., with respect to the z-direction) with layers of the material 910 (e.g., third layers), such that the material 910 and the material 1905 may form a staircase pattern in which each step of the staircase pattern is associated with a sidewall of a layer of the material 1905 (e.g., in contact with a sidewall of a layer of the material 1605). In some cases, the material 1905 may be etched (e.g., in a recess etch operation) back into the voids 1901 (e.g., clear of the isolation region 1815) to provide electrical isolation between word lines 265.

Following the formation of word lines 265 at least in part with the material 1905, the isolation regions 1815 may be filled with a material 1910 (e.g., a dielectric material, a third dielectric material), which may be the same as the material 910, or the material 1605, among other materials of the material arrangement 300. Thus, the isolation regions 1815 may provide electrical isolation and mechanical structure between blocks 210 (e.g., between regions 345, between regions 355) after forming the word lines 265 of the blocks (e.g., isolating the word lines 265 from one another). The isolation regions 1815 may be on opposite sides (e.g., along the x-direction) of an array region of the material arrangement (e.g., a region 345) from isolation regions 1715.

Figure 20A:
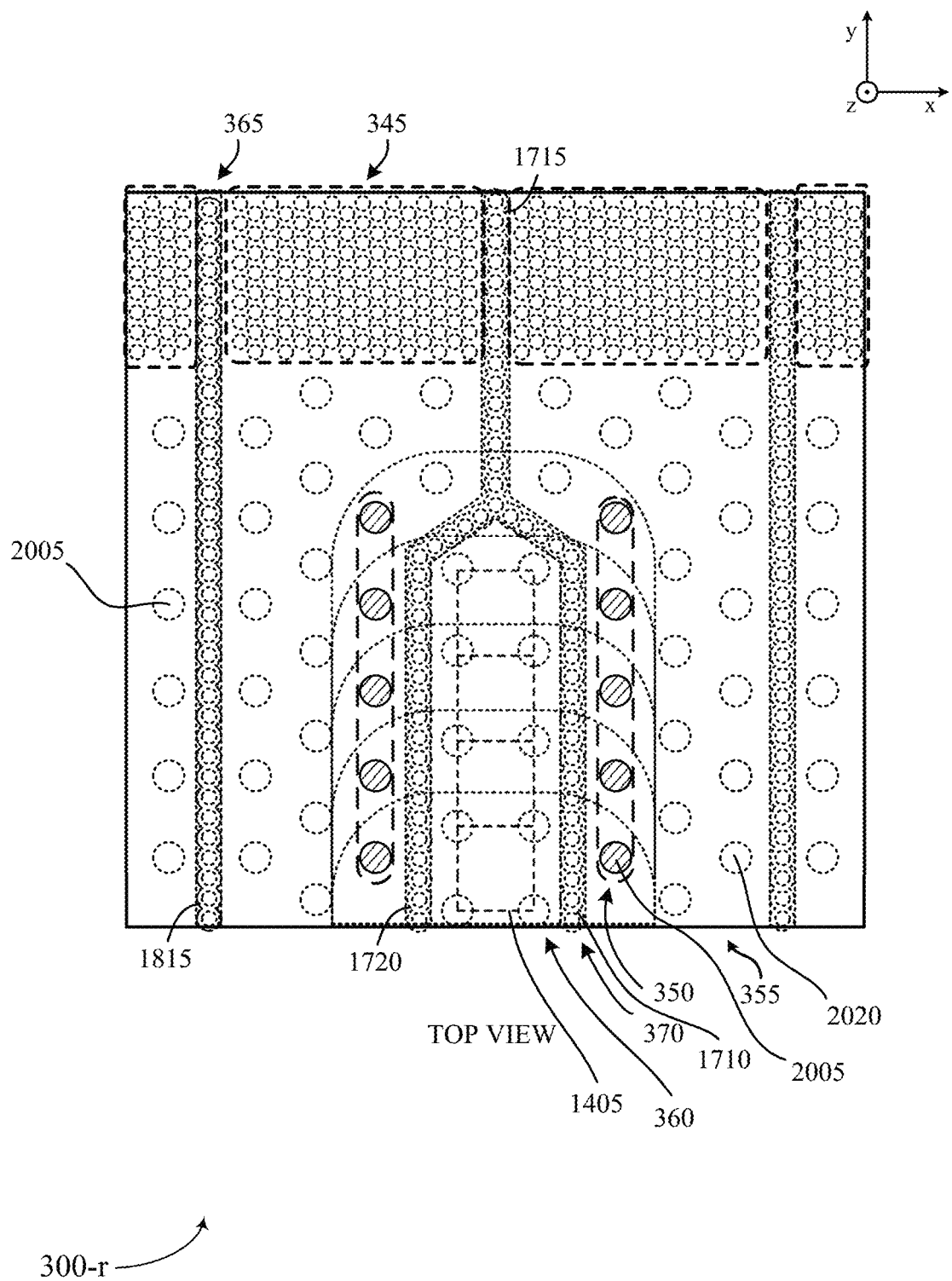
Figure 20B:
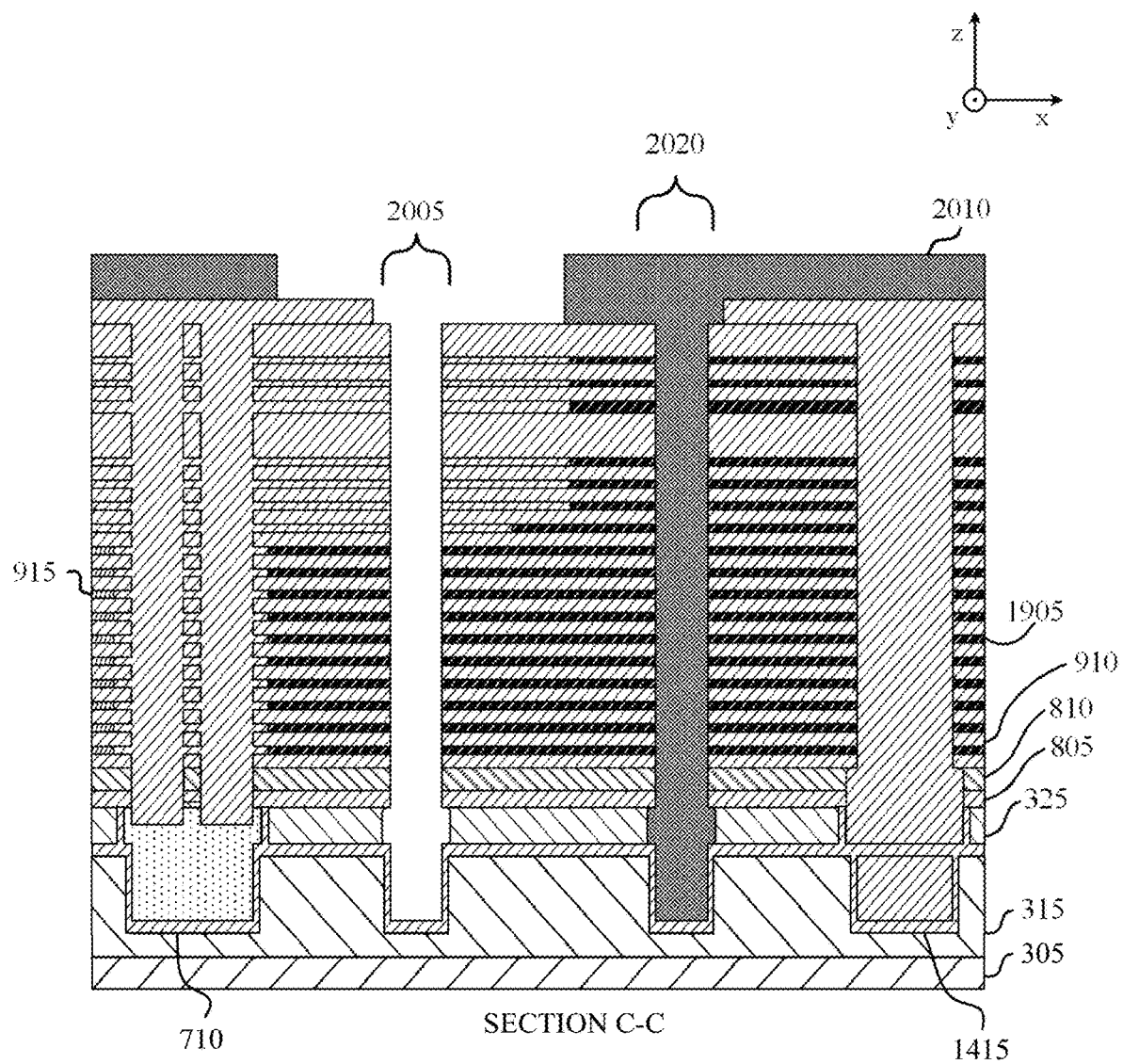

FIGS. 20A and 20B illustrates the material arrangement 300 (e.g., as a material arrangement 300-r) after an eighteenth set of one or more operations. The eighteenth set of operations may include operations (e.g., photolithography operations) that clear cavities 2005 (e.g., a fourth subset of cavities) and cavities 2020 (e.g., a fifth subset of cavities) for forming contacts (e.g., electrical contacts) and filling cavities associated with support structures (e.g., structural pillars), respectively. For example, the sixteenth set of operation includes removing the material 1610 (e.g., via photolithography) at locations corresponding to the region 350 and the region 355. Removing the material 1610 over such locations may expose a top surface of a material 1005 (e.g., at openings of the cavities 1110-b in the regions 350, at openings of the cavities 1110-c in the regions 355), which may support subsequent material removal operations.

The eighteenth set of operations may also include material removal operations (e.g., etching operations, wet etching operations, exhuming operations) that supports forming the cavities 2005 and the cavities 2020. For example, the sixteenth set of operations may include removing exposed portions (e.g., portions exposed based on removing portions of the material 1605, and other selective etching operations of the eighteenth set of operations) of the material 1002, the material 1005, the material 710, and the material 705 at locations in the regions 350 to form cavities 2005 and at locations in the regions 355 to form cavities 2020. Such material removal operations may expose sidewalls of the material 910, the material 915, the material 1905, the material 810, the material 805, the material 325, and the material 1415.

The eighteenth set of operations may include operations (e.g., oxide deposition operations) that forming a cover over the cavities 2020 and exposed portions of the material arrangement 300. For example, the eighteenth set of operations may include depositing a material 2010 in the cavities 2020 and over the material arrangement 300 in at least the regions 345, 355, 360, 365, 370, and 375 (e.g., over the material 1610, over the material 910). The material 2010 may include various materials, and may function as a resist strip to cover (e.g., protect) the cavities 2020 and the regions 355, 360, 365, 370, and 375 in subsequent material removal operations. In various examples, the regions 350 may be masked to prevent material deposition in the cavities 2005, or the cavities 2005 may be formed after or cleared out after depositing the material 2010.

Figure 21:
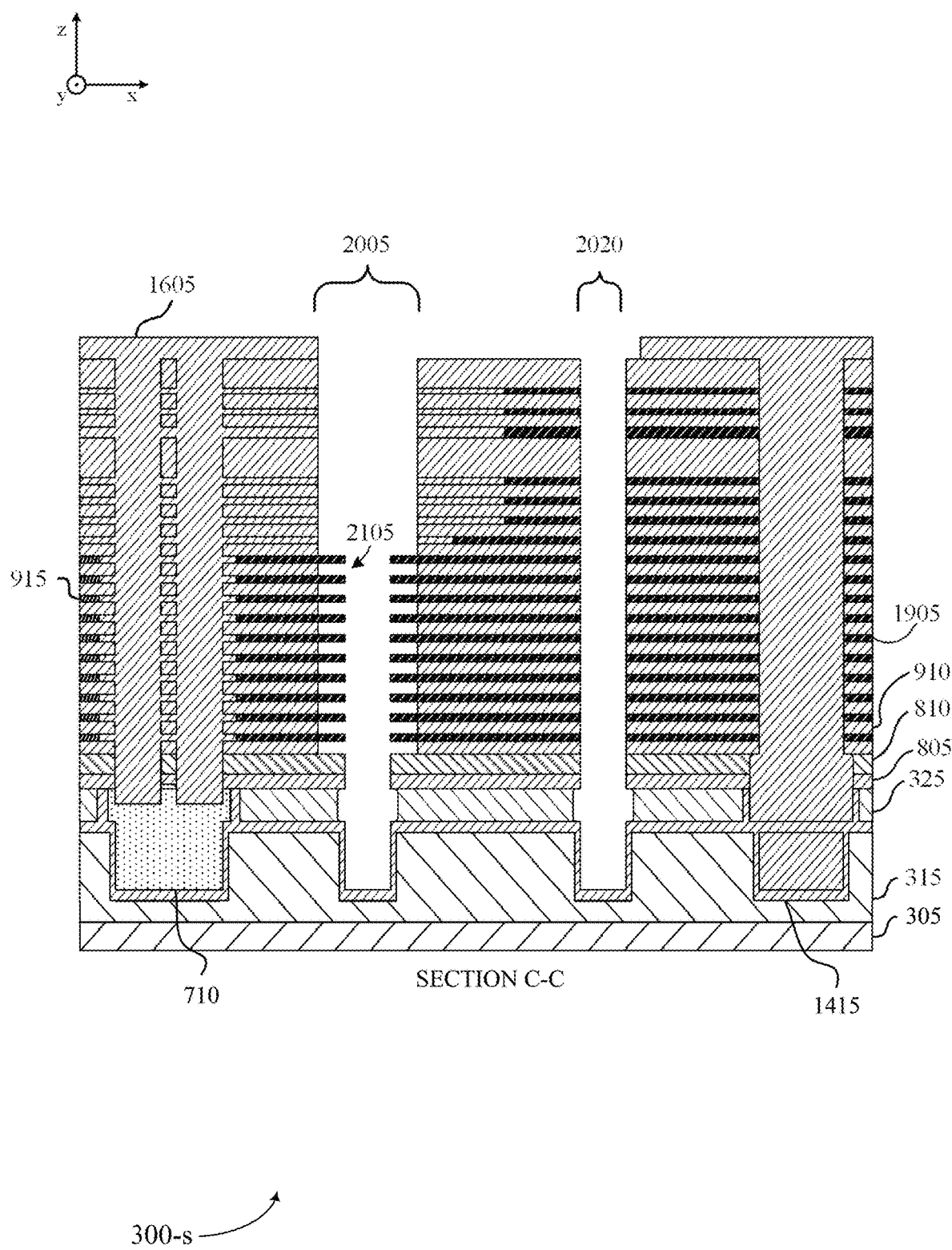

FIG. 21 illustrates the material arrangement 300 (e.g., as a material arrangement 300-s) after a nineteenth set of one or more operations, as a cross-sectional side view (e.g., relative to the cut C-C). The nineteenth set of operations may include operations (e.g., etching operations, exhuming operations) that support forming electrical contacts for the word lines 265 in the cavities 2005. For example, the nineteenth set of operations may include removing exposed portions of the material 910 and the material 1605 from the cavities 2005 (e.g., expanding the cavities 2005) to form voids 2105 between layers of the material 1905 (e.g., exposing top, bottom, and sidewall surfaces of the material 1905 in the cavities 2005). The nineteenth set of operations may also include operations (e.g., etching operations, exhuming operations) to remove the material 2010 (from the cavities 2020 and over the regions 355, 360, 365, and 370) after forming the voids 2105, thus clearing the cavities 2020.

Figure 22A:
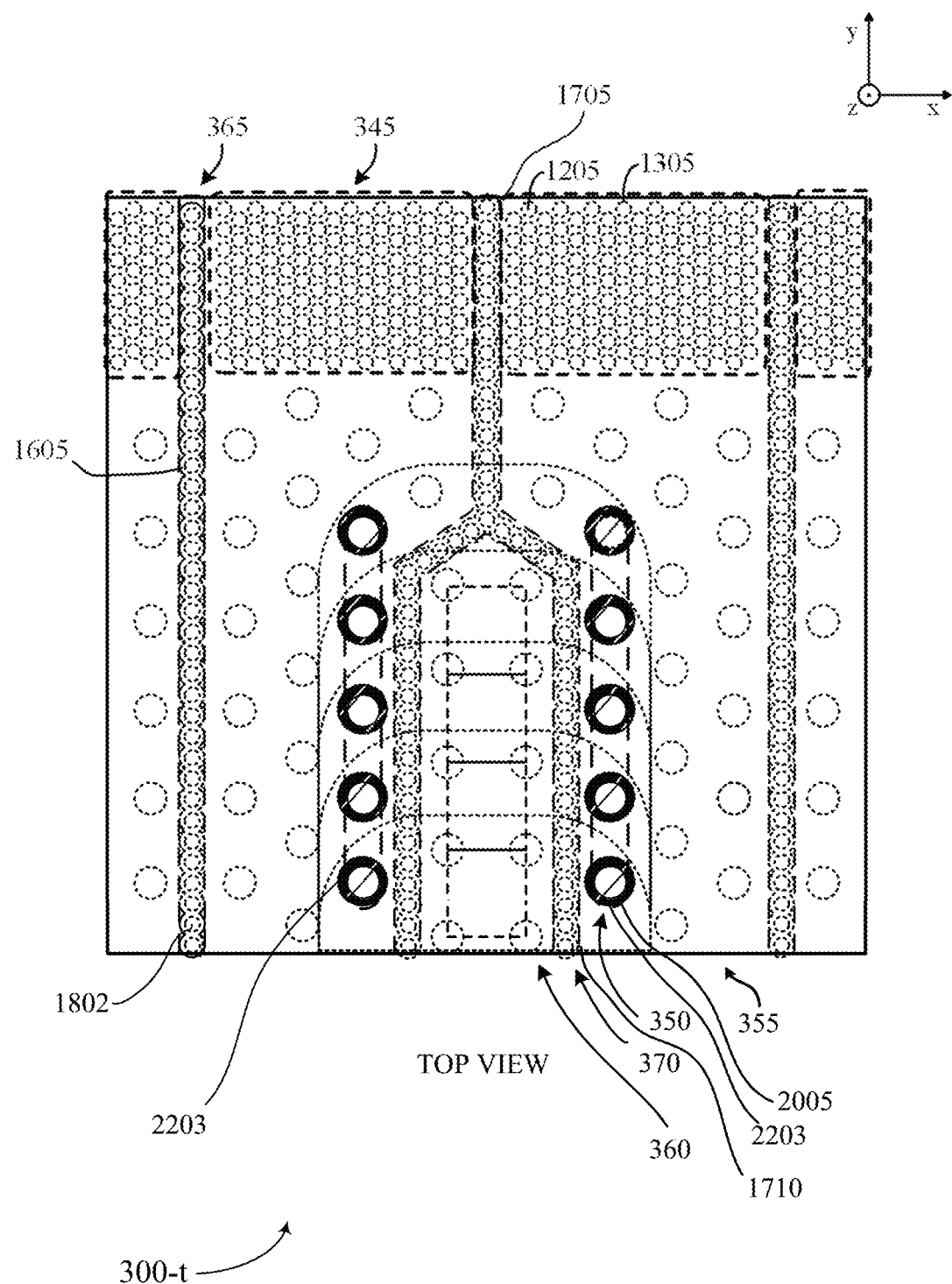
Figure 22B:
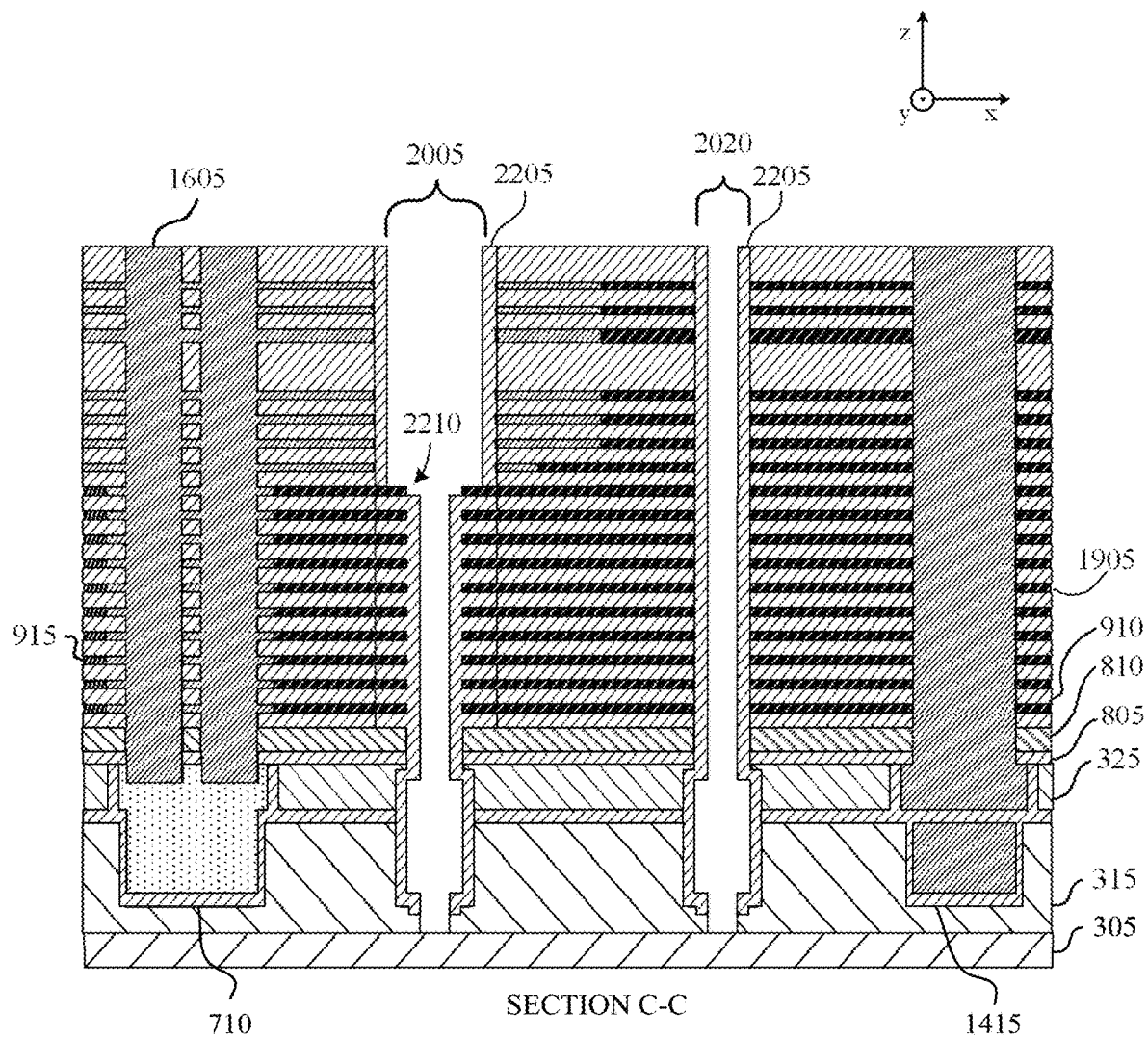

FIGS. 22A and 22B illustrates the material arrangement 300 (e.g., as a material arrangement 300-t) after a twentieth set of one or more operations. The twentieth set of operations may include operations (e.g., oxide deposition operations) that further support forming electrical contacts for word lines 265 in the cavities 2005, among other features. For example, the twentieth set of operations may include depositing a material 2205 in the cavities 2005 and the cavities 2020 (e.g., as a surface deposition, as a conformal deposition). In some examples, the material 2205 may be the same as the material 910 (e.g., an oxide material, a spacer oxide material). In some examples, the material 2205 may cover layers of the material 1905 in the cavities 2005 (e.g., filling voids 2105) and layers of the material 910 and layers of the material 1905 in the cavities 2020.

The twentieth set of operations may include operations (e.g., etching operations, dry etching operations) to expose contact surfaces 2210 (e.g., shoulder contacts) in the cavities 2005. For example, the twentieth set of operations may include removing portions of the material 2205 from the cavities 2005 to expose a top layer of the material 1905 in each of the cavities 2005. In some examples, a different layer (e.g., along the z-direction) of the material 1905 may be exposed to form a contact surface 2210 in each of the cavities 2005 of a given region 350, such that the contact surfaces 2210 formed in respective cavities 2005 may support unique addressing (e.g., biasing) of word line 265 for a respective page 215 (e.g., of memory cells 205 in a corresponding region 345). The etching operations also may remove portions of the material 315, exposing respective surfaces of the material 305 at the bottom of cavities 2005.

Figure 23:
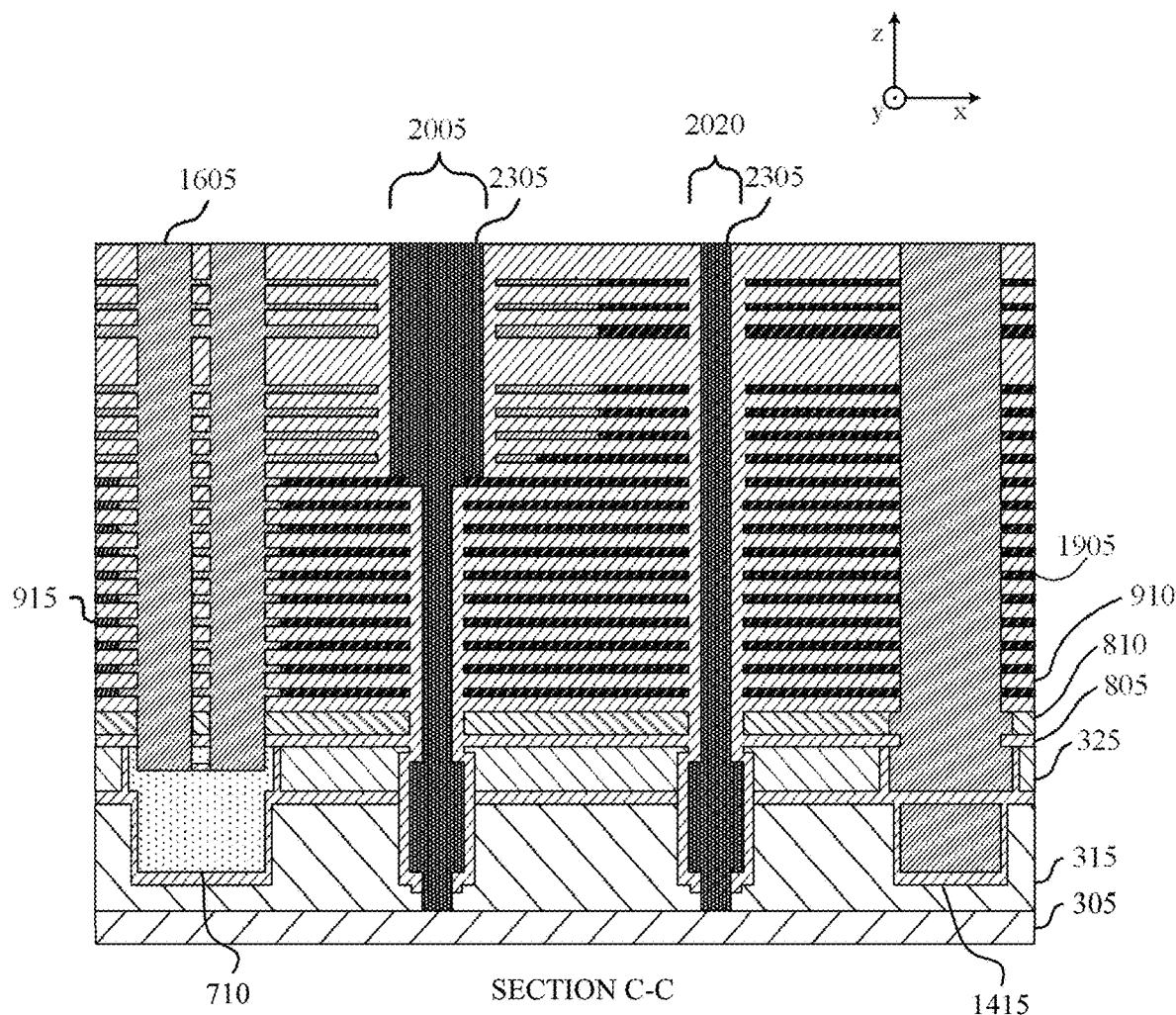

FIG. 23 illustrates the material arrangement 300 (e.g., as a material arrangement 300-*u*) after a twenty-first set of one or more operations, as a cross-sectional view (e.g., of the cut C-C). The twenty-first set of operations may include operations (e.g., one or more deposition operations, metal fill operations, planarizing operations) that support forming electrical contacts (e.g., for accessing the word lines 265, among other features). For example, the twenty-first set of operations may include depositing a material 2305 in the cavities 2005 and the cavities 2020. The material 2305 may include one or more conductive materials (e.g., second conductive materials), such as tungsten. The material 2305 may be coupled with (e.g., in electrical contact with) the contact surface 2210 in each of the cavities 2005, forming contacts for the word lines 265. In some examples, the material 2305 deposited in the cavities 2005, or the cavities 2020, or both may support a through-array contact, such as a contact with circuitry under the material arrangement 300 or in some other portion of the material arrangement (e.g., circuitry of a substrate 301). The twenty-first set of operations may also include operations (e.g., planarizing operations) to flatten a top surface of the material arrangement 300-*u* (e.g., via CMP).

Thus, in accordance with the examples of the first through twenty-first sets of operations, aspects of the memory architecture 200 may be formed through various additive and subtractive operations, including techniques for performing concurrent cavity-forming operations to improve process margins and processing cost associated with the sets of manufacturing operations. For example, common operations may concurrently form a set of multiple cavities (e.g., cavities 335, cavities 920, cavities 1110, and other related cavities), where subsets of the cavities may support various features of the memory architecture 200 (e.g., memory cells 205, blocks 210, strings 220, word lines 265). Further, the formation of a sacrificial region (e.g., a sacrificial island) may be supported by a subset of such cavities (e.g., cavities 335, cavities 920, cavities 1110) that support the formation of various structures of the memory architecture 200 (e.g., based on forming a staircase 1405). Such sacrificial island may be electrically isolated by isolation regions formed at least in part from other subsets of such cavities in subsequent process steps, which may isolate relatively imprecise features of the material arrangement 300 and accordingly improve the reliability or manufacturability of the material arrangement 300.

Figure 24:
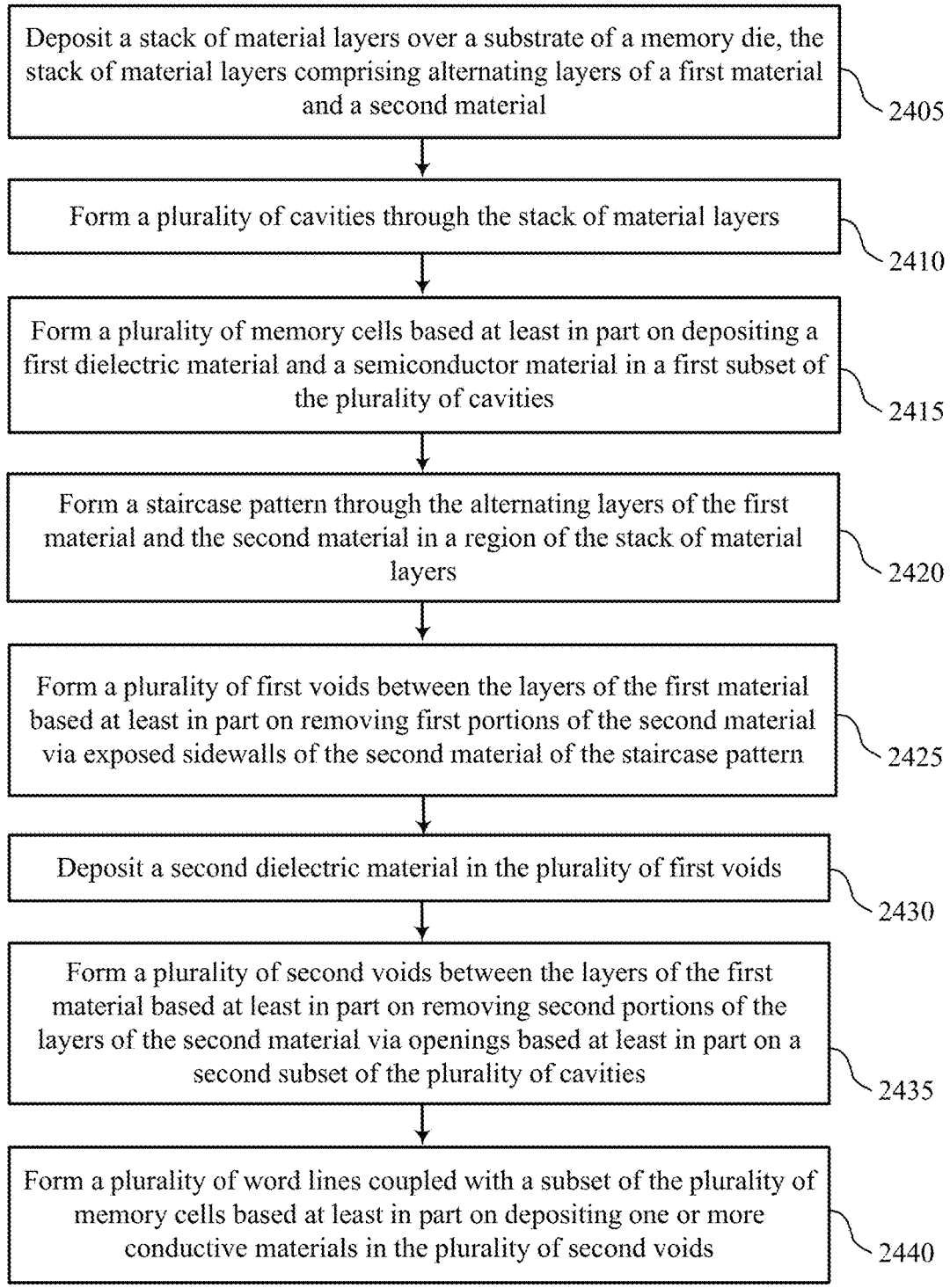
FIG. 24 shows a flowchart illustrating a method or methods that support techniques for concurrently-formed cavities in three-dimensional memory arrays in accordance with examples as disclosed herein.

FIG. 24 shows a flowchart illustrating a method or methods 2400 that supports techniques for concurrently-formed cavities in three-dimensional memory arrays in accordance with examples as disclosed herein. The operations of method 2400 may be implemented by a manufacturing system or one or more components associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 2405, the method 2400 may include depositing a stack of material layers over a substrate of a memory die, the stack of material layers including alternating layers of a first material and a second material. The operations of 2405 may be performed in accordance with examples as disclosed herein.

At 2410, the method 2400 may include forming a plurality of cavities through the stack of material layers. The operations of 2410 may be performed in accordance with examples as disclosed herein.

At 2415, the method 2400 may include forming a plurality of memory cells based at least in part on depositing a first dielectric material and a semiconductor material in a first subset of the plurality of cavities. The operations of 2415 may be performed in accordance with examples as disclosed herein.

At 2420, the method 2400 may include forming a staircase pattern through the alternating layers of the first material and the second material in a region of the stack of material layers. The operations of 2420 may be performed in accordance with examples as disclosed herein.

At 2425, the method 2400 may include forming a plurality of first voids between the layers of the first material based at least in part on removing first portions of the second material via exposed sidewalls of the second material of the staircase pattern. The operations of 2425 may be performed in accordance with examples as disclosed herein.

At 2430, the method 2400 may include depositing a second dielectric material in the plurality of first voids. The operations of 2430 may be performed in accordance with examples as disclosed herein.

At 2435, the method 2400 may include forming a plurality of second voids between the layers of the first material based at least in part on removing second portions of the layers of the second material via openings based at least in part on a second subset of the plurality of cavities. In some examples, forming the plurality of second voids may expose one or more surfaces of the second dielectric material. The operations of 2435 may be performed in accordance with examples as disclosed herein.

At 2440, the method 2400 may include forming a plurality of word lines coupled with a subset of the plurality of memory cells based at least in part on depositing one or more conductive materials in the plurality of second voids. The operations of 2440 may be performed in accordance with examples as disclosed herein.

In some examples, an apparatus (e.g., a manufacturing system) as described herein may perform a method or methods, such as the method 2400. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for: depositing a stack of material layers over a substrate of a memory die, the stack of material layers including alternating layers of a first material and a second material; forming a plurality of cavities through the stack of material layers; forming a plurality of memory cells based at least in part on depositing a first dielectric material and a semiconductor material in a first subset of the plurality of cavities; forming a staircase pattern through the alternating layers of the first material and the second material in a region of the stack of material layers; forming a plurality of first voids between the layers of the first material based at least in part on removing first portions of the second material via exposed sidewalls of the second material of the staircase pattern; depositing a second dielectric material in the plurality of first voids; forming a plurality of second voids between the layers of the first material based at least in part on removing second portions of the layers of the second material via openings based at least in part on a second subset of the plurality of cavities (e.g., which may expose one or more surfaces of the second dielectric material); and forming a plurality of word lines coupled with a subset of the plurality of memory cells based at least in part on depositing one or more conductive materials in the plurality of second voids.

Aspect 2: The method or apparatus of aspect 1, where the second dielectric material is the same as the first material.

Aspect 3: The method or apparatus of any of aspects 1 through 2, further including operations, features, circuitry, logic, means, or instructions, or any combination thereof for forming, for each word line of the plurality of word lines, a respective electrical contact through the stack of material layers based at least in part on depositing one or more second conductive materials in a respective cavity of a fourth subset of the plurality of cavities.

Aspect 4: The method or apparatus of any of aspects 1 through 3, further including operations, features, circuitry, logic, means, or instructions, or any combination thereof for forming, before forming the plurality of second voids, a plurality of structural pillars in contact with the layers of the first material based at least in part on depositing one or more fourth materials in a fifth subset of the plurality of cavities.

Aspect 5: The method or apparatus of any aspects 1 through 4, further including operations, features, circuitry, logic, means, or instructions, or any combination thereof for forming an isolation region based at least in part on merging the second subset of the plurality of cavities to form a first trench and depositing a third dielectric material in the first trench.

Aspect 6: The method or apparatus of aspect 5, further including operations, features, circuitry, logic, means, or instructions, or any combination thereof for merging the second subset of the plurality of cavities before depositing the one or more conductive materials and depositing the third dielectric material after depositing the one or more conductive materials.

Aspect 7: The method or apparatus of any of aspects 5 through 6, further including operations, features, circuitry, logic, means, or instructions, or any combination thereof for forming a second isolation region between the subset of the plurality of memory cells and a second subset of the plurality of memory cells based at least in part on merging a third subset of the plurality of cavities to form a second trench through the stack of material layers and on depositing a fourth dielectric material in the second trench.

Aspect 8: The method or apparatus of aspect 7 where the second isolation region is opposite the first subset of the plurality of memory cells from the isolation region.

Aspect 9: The method or apparatus of any of aspects 7 through 8, further including operations, features, circuitry, logic, means, or instructions, or any combination thereof for forming a third isolation region between the staircase pattern and the plurality of word lines based at least in part on merging a sixth subset of the plurality of cavities to form a third trench and depositing a fifth dielectric material in the third trench.

Aspect 10: The method or apparatus of aspect 9 where the second isolation region and the third isolation region are coincident.

Aspect 11: The method or apparatus of any of aspects 9 through 10, where the fifth dielectric material is the same as the fourth dielectric material.

Aspect 12: The method or apparatus of any of aspects 1 through 11, further including operations, features, circuitry, logic, means, or instructions, or any combination thereof for forming a plurality of second word lines coupled with a second subset of the plurality of memory cells based at least in part on depositing the one or more conductive materials between the layers of the first material via a seventh subset of the plurality of cavities and forming a fourth isolation region based at least in part on merging the seventh subset of the plurality of cavities to form a fourth trench and depositing the third dielectric material in the fourth trench.

Aspect 13: The method or apparatus of any of aspects 1 through 12 where the plurality of cavities are formed concurrently.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 14: An apparatus, including: a first portion of a memory die including a first stack of material layers over a substrate, the first stack of material layers including an alternation of first layers of a first material and second layers of a second material, the first layers of the first material formed in in a first staircase pattern with each step of the first staircase pattern associated with a sidewall of a first layer of the first material; a second portion of the memory die including a second stack of material layers over the substrate, the second stack of material layers including an alternation of third layers of the first material and fourth layers of a third material, the fourth layers of the third material formed in a second staircase pattern with each step of the second staircase pattern associated with a sidewall of a respective fourth layer of the third material; a plurality of strings of memory cells through second stack of materials in the second portion of the memory die, where each memory cell of the plurality of strings is electrically coupled with one of the fourth layers of the third material; and an isolation region including a dielectric material electrically isolating the first portion of the memory die and the second portion of the memory die.

Aspect 15: The apparatus of aspect 14, further including: a plurality of electrical contacts through the second stack of material layers in the second portion of the memory die, where each electrical contact is coupled with a respective one of the fourth layers of the third material.

Aspect 16: The apparatus of claim 14 through 15 apparatus, where each first layer of the first material is overlapping, in a height dimension relative to the substrate, with a respective third layer of the first material.

Aspect 17: The apparatus of any of aspects 14 through 16, where the third material includes one or more conductive materials.

Aspect 18: The apparatus of any of aspects 14 through 17, where the second material is the same as the first material.

An apparatus is described. The following provides an overview of aspects of the apparatus as described herein:

Aspect 19: An apparatus formed by a process including: depositing a stack of material layers over a substrate of a memory die, the stack of material layers including alternating layers of a first material and a second material; forming a plurality of cavities through the stack of material layers; forming a plurality of memory cells based at least in part on depositing a first dielectric material and a semiconductor material in a first subset of the plurality of cavities; forming a staircase pattern through the alternating layers of the first material and the second material in a region of the stack of material layers; forming a plurality of first voids between the layers of the first material based at least in part on removing first portions of the second material via exposed sidewalls of the second material of the staircase pattern; depositing a second dielectric material in the plurality of first voids; forming a plurality of second voids between the layers of the first material based at least in part on removing second portions of the layers of the second material via openings based at least in part on a second subset of the plurality of cavities (e.g., which may expose one or more surfaces of the second dielectric material); and forming a plurality of word lines coupled with a subset of the plurality of memory cells based at least in part on depositing one or more conductive materials in the plurality of second voids.

Aspect 20: The apparatus of aspect 19, formed by the process further including: forming, for each word line of the plurality of word lines, a respective electrical contact through the stack of material layers based at least in part on depositing one or more second conductive materials in a respective cavity of a fourth subset of the plurality of cavities.

Aspect 21: The apparatus of any of aspects 19 through 20, formed by the process further including: forming, before forming the plurality of second voids, a plurality of structural pillars in contact with the layers of the first material based at least in part on depositing one or more fourth materials in a fifth subset of the plurality of cavities.

Aspect 22: The apparatus of aspect 19 through 21, formed by the process further including: forming an isolation region based at least in part on merging the second subset of the plurality of cavities to form a first trench and depositing a third dielectric material in the second trench.

Aspect 23: The apparatus of aspect 22, formed by the process further including: forming a second isolation region between the subset of the plurality of memory cells and a second subset of the plurality of memory cells based at least in part on merging a third subset of the plurality of cavities to form a second trench through the stack of material layers and on depositing a fourth dielectric material in the second trench.

Aspect 24: The apparatus of aspect 23, formed by the process further including: forming a third isolation region between the staircase pattern and the plurality of word lines based at least in part on merging a sixth subset of the plurality of cavities to form a third trench and depositing a fifth dielectric material in the third trench.

Aspect 25: The apparatus of any of aspects 19 through 24, formed by the process further including: forming a plurality of second word lines coupled with a second subset of the plurality of memory cells based at least in part on depositing the one or more conductive materials between the layers of the first material via a seventh subset of the plurality of cavities; and forming a fourth isolation region based at least in part on merging the seventh subset of the plurality of cavities to form a fourth trench and depositing a third dielectric material in the fourth trench.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    depositing a stack of material layers over a substrate of a memory die, the stack of material layers comprising alternating layers of a first material and a second material;
    forming a plurality of cavities through the stack of material layers;
    forming a plurality of memory cells based at least in part on depositing a first dielectric material and a semiconductor material in a first subset of the plurality of cavities;
    forming a staircase pattern through the alternating layers of the first material and the second material in a region of the stack of material layers;
    forming a plurality of first voids between the layers of the first material based at least in part on removing first portions of the second material via exposed sidewalls of the second material of the staircase pattern;
    depositing a second dielectric material in the plurality of first voids;
    forming a plurality of second voids between the layers of the first material based at least in part on removing second portions of the layers of the second material via openings based at least in part on a second subset of the plurality of cavities, wherein forming the plurality of second voids exposes one or more surfaces of the second dielectric material; and
    forming a plurality of word lines coupled with a subset of the plurality of memory cells based at least in part on depositing one or more conductive materials in the plurality of second voids.

2. The method of claim 1, wherein the second dielectric material is the same as the first material.

3. The method of claim 1, further comprising:
    forming, for each word line of the plurality of word lines, a respective electrical contact based at least in part on depositing one or more second conductive materials in a respective cavity of a fourth subset of the plurality of cavities.

4. The method of claim 1, further comprising:
    forming, before forming the plurality of second voids, a plurality of structural pillars in contact with the layers of the first material based at least in part on depositing one or more fourth materials in a fifth subset of the plurality of cavities.

5. The method of claim 1, further comprising:
    forming an isolation region based at least in part on merging the second subset of the plurality of cavities to form a first trench and depositing a third dielectric material in the first trench.

6. The method of claim 5, wherein:
    merging the second subset of the plurality of cavities is performed before depositing the one or more conductive materials; and
    depositing the third dielectric material is performed after depositing the one or more conductive materials.

7. The method of claim 5, further comprising:
    forming a second isolation region between the subset of the plurality of memory cells and a second subset of the plurality of memory cells based at least in part on merging a third subset of the plurality of cavities to form a second trench through the stack of material layers and on depositing a fourth dielectric material in the second trench.

8. The method of claim 7, wherein the first subset of the plurality of memory cells is positioned between the second isolation region and the isolation region.

9. The method of claim 7, further comprising:
    forming a third isolation region between the staircase pattern and the plurality of word lines based at least in part on merging a sixth subset of the plurality of cavities to form a third trench and depositing a fifth dielectric material in the third trench.

10. The method of claim 9, wherein the second isolation region and the third isolation region are included in a joined isolation region.

11. The method of claim 9, wherein the fifth dielectric material is the same as the fourth dielectric material.

12. The method of claim 1, further comprising:
    forming a plurality of second word lines coupled with a second subset of the plurality of memory cells based at least in part on depositing the one or more conductive materials between the layers of the first material via openings based at least in part on a seventh subset of the plurality of cavities; and
    forming a fourth isolation region based at least in part on merging the seventh subset of the plurality of cavities to form a fourth trench and depositing a third dielectric material in the fourth trench.

13. The method of claim 1, wherein the plurality of cavities are formed concurrently.

14. An apparatus formed by a process comprising:
    depositing a stack of material layers over a substrate of a memory die, the stack of material layers comprising alternating layers of a first material and a second material;
    forming a plurality of cavities through the stack of material layers;
    forming a plurality of memory cells based at least in part on depositing a first dielectric material and a semiconductor material in a first subset of the plurality of cavities;
    forming a staircase pattern through the alternating layers of the first material and the second material in a region of the stack of material layers;
    forming a plurality of first voids between the layers of the first material based at least in part on removing first portions of the second material via exposed sidewalls of the second material of the staircase pattern;
    depositing a second dielectric material in the plurality of first voids;

forming a plurality of second voids between the layers of the first material based at least in part on removing second portions of the layers of the second material via openings based at least in part on a second subset of the plurality of cavities, wherein forming the plurality of second voids exposes one or more surfaces of the second dielectric material; and forming a plurality of word lines coupled with a subset of the plurality of memory cells based at least in part on depositing one or more conductive materials in the plurality of second voids.

15. The apparatus of claim 14, formed by the process further comprising:
forming, for each word line of the plurality of word lines, a respective electrical contact based at least in part on depositing one or more second conductive materials in a respective cavity of a fourth subset of the plurality of cavities.

16. The apparatus of claim 14, formed by the process further comprising:
forming, before forming the plurality of second voids, a plurality of structural pillars in contact with the layers of the first material based at least in part on depositing one or more fourth materials in a fifth subset of the plurality of cavities.

17. The apparatus of claim 14, formed by the process further comprising:
forming an isolation region based at least in part on merging the second subset of the plurality of cavities to form a first trench and depositing a third dielectric material in the first trench.

18. The apparatus of claim 17, formed by the process further comprising:
forming a second isolation region between the subset of the plurality of memory cells and a second subset of the plurality of memory cells based at least in part on merging a third subset of the plurality of cavities to form a second trench through the stack of material layers and on depositing a fourth dielectric material in the second trench.

19. The apparatus of claim 18, formed by the process further comprising:
forming a third isolation region between the staircase pattern and the plurality of word lines based at least in part on merging a sixth subset of the plurality of cavities to form a third trench and depositing a fifth dielectric material in the third trench.

20. The apparatus of claim 14, formed by the process further comprising:
forming a plurality of second word lines coupled with the second subset of the plurality of memory cells based at least in part on depositing the one or more conductive materials between the layers of the first material via a seventh subset of the plurality of cavities; and
forming a fourth isolation region based at least in part on merging the seventh subset of the plurality of cavities to form a fourth trench and depositing a third dielectric material in the fourth trench.

21. The apparatus of claim 14, wherein the second dielectric material is the same as the first material.

22. The apparatus of claim 17, wherein:
merging the second subset of the plurality of cavities is performed before depositing the one or more conductive materials; and
depositing the third dielectric material is performed after depositing the one or more conductive materials.

23. The apparatus of claim 18, wherein the first subset of the plurality of memory cells is positioned between the second isolation region and the isolation region.

24. The apparatus of claim 19, wherein the second isolation region and the third isolation region are included in a joined isolation region.

25. The apparatus of claim 19, wherein the fifth dielectric material is the same as the fourth dielectric material.

* * * * *